(12) United States Patent
Chiang et al.

(10) Patent No.: US 11,855,079 B2
(45) Date of Patent: Dec. 26, 2023

(54) INTEGRATED CIRCUIT WITH BACKSIDE TRENCH FOR METAL GATE DEFINITION

(71) Applicant: Taiwan Semiconductor Manufacturing Co., Ltd., Hsinchu (TW)

(72) Inventors: Kuo-Cheng Chiang, Hsinchu (TW); Jung-Chien Cheng, Hsinchu (TW); Shi-Ning Ju, Hsinchu (TW); Guan-Lin Chen, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 133 days.

(21) Appl. No.: 17/484,956

(22) Filed: Sep. 24, 2021

(65) Prior Publication Data

US 2022/0352150 A1 Nov. 3, 2022

Related U.S. Application Data

(60) Provisional application No. 63/182,252, filed on Apr. 30, 2021.

(51) Int. Cl.
| H01L 27/088 | (2006.01) |
| H01L 29/06 | (2006.01) |
| H01L 29/66 | (2006.01) |
| H01L 29/423 | (2006.01) |
| H01L 21/762 | (2006.01) |

(52) U.S. Cl.
CPC ...... *H01L 27/088* (2013.01); *H01L 21/76224* (2013.01); *H01L 29/0649* (2013.01); *H01L 29/0673* (2013.01); *H01L 29/4232* (2013.01); *H01L 29/66477* (2013.01)

(58) Field of Classification Search
CPC .............. H01L 27/088; H01L 27/0886; H01L 21/76224; H01L 21/823481; H01L 29/0649; H01L 29/4232; H01L 29/66477; H01L 29/6681; H01L 29/42392; H01L 29/66439; H01L 29/66545; H01L 29/78696
See application file for complete search history.

(56) References Cited

U.S. PATENT DOCUMENTS

| 9,236,267 | B2 | 1/2016 | De et al. |
| 9,502,265 | B1 | 11/2016 | Jiang et al. |
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 11,610,805 | B2 * | 3/2023 | Huang ............... H01L 29/775 |

(Continued)

*Primary Examiner* — Dao H Nguyen
(74) *Attorney, Agent, or Firm* — Seed IP Law Group LLP

(57) ABSTRACT

An integrated circuit includes a first nanosheet transistor and a second nanosheet transistor on a substrate. The first and second nanosheet each include gate electrodes. A gate isolation structure extends from a backside of the substrate between the gate electrodes. The gate isolation structure physically and electrically isolates the first and second gate electrodes from each other.

20 Claims, 35 Drawing Sheets

(56) References Cited

U.S. PATENT DOCUMENTS

2022/0262915 A1* 8/2022 Su ..................... H01L 27/0886
2022/0271139 A1* 8/2022 Su ..................... H01L 29/78696
2022/0384250 A1* 12/2022 Huang ................ H01L 29/775

* cited by examiner

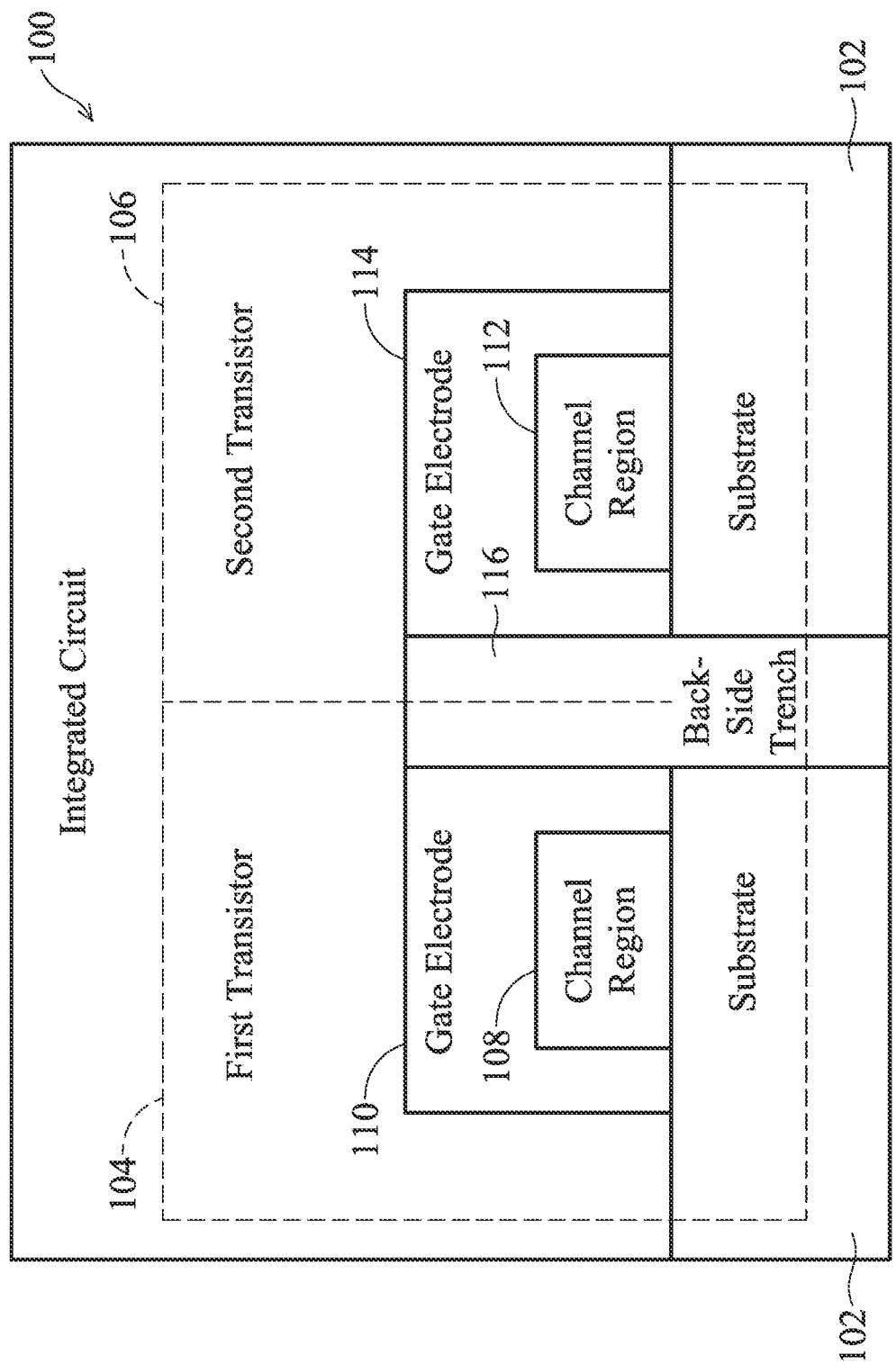

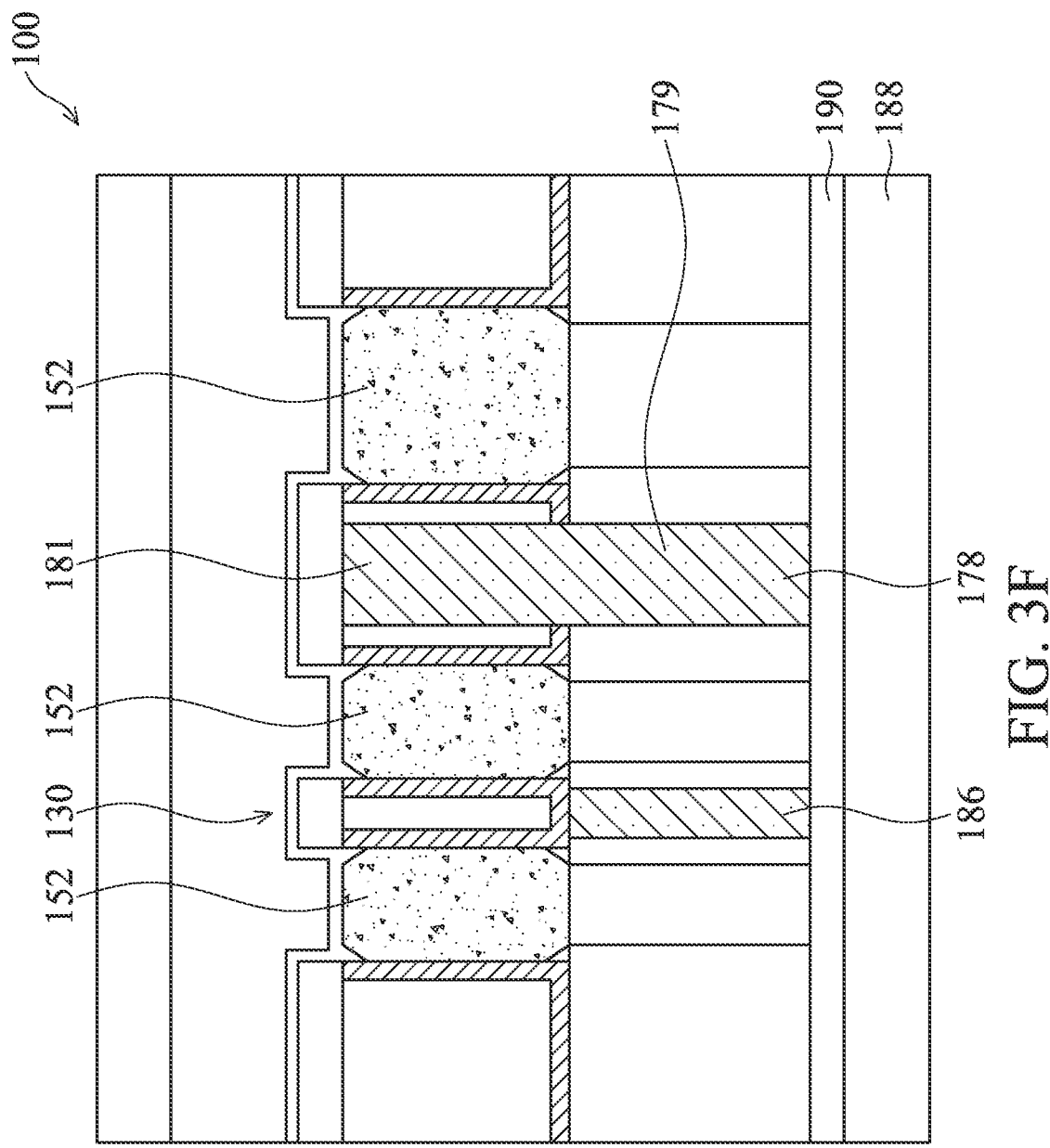

INTEGRATED CIRCUIT WITH BACKSIDE TRENCH FOR METAL GATE DEFINITION

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanosheet transistors can assist in increasing computing power because the nanosheet transistors can be very small and can have improved functionality over convention transistors. A nanosheet transistor may include a plurality of semiconductor nanosheets (e.g. nanowires, nanosheets, etc.) that act as the channel regions for a transistor. Gate terminals may be coupled to the nanosheets. It can be difficult to form gate terminals with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a block diagram of an integrated circuit 100, in accordance with some embodiments.

DETAILED DESCRIPTION

Figure 2A:
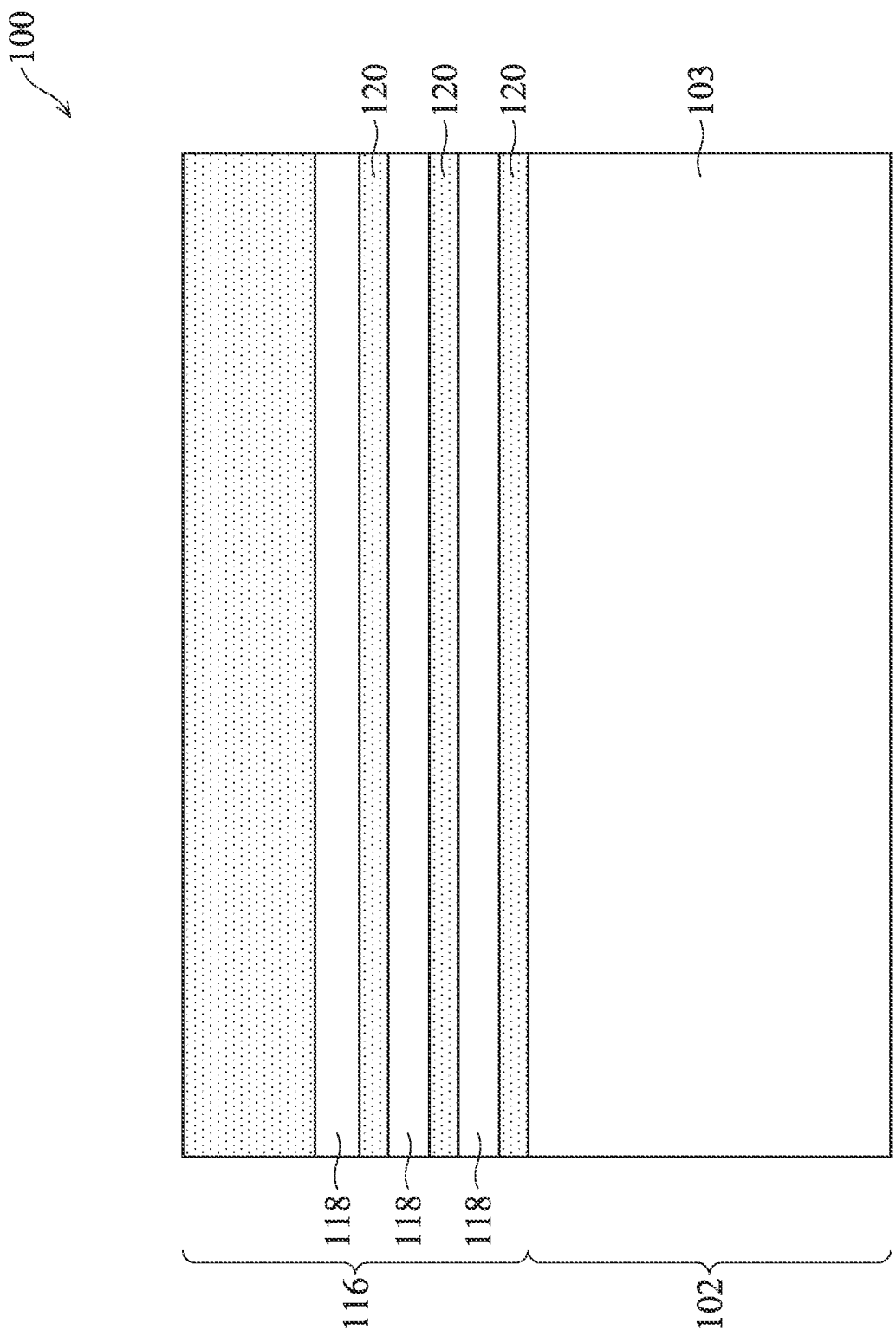
FIGS. 2A-3F are cross-sectional and perspective views of an integrated circuit at various stages of processing, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanosheet transistors having improved performance. The nanosheet transistors each have a plurality of nanosheets formed over a substrate. The nanosheets act as channel regions of the nanosheet transistor. Each nanosheet transistor includes a gate electrode over the channel region. When the gate metals of the gate electrodes are initially deposited, all of the gate electrodes may initially be electrically shorted together. Embodiments of the present disclosure advantageously electrically isolate the individual gate electrodes by utilizing backside trenches to cut the gate metals. The backside trenches are etched from the backside of the substrate and through the gate metals. The backside trenches cut through the gate metals between the transistors and thereby remove conductive materials that would otherwise electrically short the gate electrodes of adjacent transistors.

This process provides many benefits. Gate metals can be cut and hybrid fins that separate adjacent transistors can be removed in a self-aligned process. This can avoid utilizing a separate photolithography process to cut the gate metals. Furthermore, an isolation wall can replace the hybrid fin within a narrower space, thereby allowing high density formation of transistors. Alternatively, a wider isolation wall can be utilized and achieve better isolation capability. Furthermore, transistor heights can be reduced utilizing this process. All of this results in more cost-effective and efficient formation of transistors, better functioning transistors, and higher wafer yields.

FIG. 1 is a block diagram of an integrated circuit 100, in accordance with some embodiments. The integrated circuit 100 includes a substrate 102. The integrated circuit also includes a first transistor 104 and a second transistor 106 above the substrate 102. As set forth in more detail below, the integrated circuit 100 selectively utilizes backside trenches to electrically isolate the gate electrodes of the first transistor 104 and the second transistor 106.

The first transistor 104 includes a channel region 108 and a gate electrode 110. The second transistor 106 includes a channel region 112 and the gate electrode 114. The first transistor 104 can be operated by applying a voltage to the gate electrode 110. This can prevent or enable current to flow between the source/drain regions (not shown) of the transistor 104 through the channel region 108. The second transistor can be operated by applying a voltage to the gate electrode 114. This can prevent or enable current to flow between the source/drain regions (not shown) of the transistor 106 through the channel region 112.

The integrated circuit 100 includes a backside trench 116. The backside trench 116 passes through the substrate 102 and between the gate electrode 110 and 114 of the transistors 104 and 106. The backside trench physically separates the gate electrode 110 from the gate electrode 114. This physical separation also corresponds to electrical isolation of the gate electrode 110 and the gate electrode 114. This electrical isolation enables the first and second transistors 104 and 106 to be operated independently of each other.

The backside trench 116 may be filled with a dielectric material. The dielectric material contributes to the electrical isolation of the gate electrodes 110 and 114. The dielectric material may be a low K dielectric material such as SiCN, silicon oxide, or silicon oxide. Other materials can be utilized without departing from the scope of the present disclosure. Accordingly, the backside trench 116 filled with the dielectric material corresponds to a gate isolation structure.

The process of forming the backside trench 116 can be performed in conjunction with thinning of the substrate 102. After front side processing to substantially form the transistors 104 and 106, it may be beneficial to reduce the thickness of the substrate 102. Typically this involves attaching a carrier wafer to the front side of the integrated circuit 100 and flipping the integrated circuit 100 so the back surface of the substrate 102 is exposed and facing upward. Various etching processes are then utilized to remove portions of the substrate 102 in order to reduce the thickness of the substrate 102.

After reduction of the thickness of the substrate 102, the backside trench 116 can be formed. Prior to formation of the backside trench, the gate electrode 110 and the gate electrode 114 may be a single contiguous metal gate. The backside trench is formed through the substrate 102 via the backside of the substrate 102 and through the contiguous metal gate structure that forms the gate electrodes 110 and 114. The trench etches away a portion of the metal gate structure between the first and second transistors 104 and 106, thereby electrically isolating the gate electrode 110 from the gate electrode 114.

In some embodiments, the first and second transistors 104 and 106 are nanosheet transistors. In this case, the channel regions 108 and 112 are each made of a plurality of semiconductor channels extending between the source/drain regions of the first transistor 104, and between the source/drain regions of the second transistor 106. The semiconductor channels may include nanosheets, nanowires, or other types of nanostructures. The channel regions 108 and 112 may be part of respective fin structures extending above the semiconductor substrate 102. Other types of transistors may be utilized without departing from the scope of the present disclosure.

FIGS. 2A-3F are cross-sectional views of an integrated circuit 100 at various stages of processing, according to some embodiments. FIGS. 2A-3F illustrate an exemplary process for producing an integrated circuit that includes nanosheet transistors. FIGS. 2A-3F illustrate how these transistors can be formed in a simple and effective process in accordance with principles of the present disclosure. Other process steps and combinations of process steps can be utilized without departing from the scope of the present disclosure. The transistors can include gate all around transistors, multi-bridge transistors, nanosheet transistors, nanowire transistors, or other types of nanostructure transistors.

The nanosheet transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanosheet structure.

In FIG. 2A the integrated circuit 100 includes a semiconductor substrate 102. In one embodiment, the substrate 102 includes a semiconductor material 103. The semiconductor material 103 may include a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 includes a semiconductor stack 116 on the substrate 102. The semiconductor stack 116 includes a plurality of semiconductor layers 118. The semiconductor layers 118 are layers of semiconductor material. The semiconductor layers 118 correspond to the channel regions of the nanosheet transistors that will result from the process described. The semiconductor layers 118 are formed over the substrate 102. The semiconductor layers 118 may include one or more layers of Si, Ge, SiGe, GaAs, InSb, GaP, GaSb, InAlAs, InGaAs, GaSbP, GaAsSb or InP. In one embodiment, the semiconductor layers 118 are the same semiconductor material as the substrate 102. Other semiconductor materials can be utilized for the semiconductor layers 118 without departing from the scope of the present disclosure. In a primary non-limiting example described herein, the semiconductor layers 118 and the substrate 102 are silicon.

The integrated circuit 100 includes a plurality of sacrificial semiconductor layers 120 positioned between the semiconductor layers 118. The sacrificial semiconductor layers 120 include a different semiconductor material than the semiconductor layers 118. In an example in which the semiconductor layers 118 include silicon, the sacrificial semiconductor layers 120 may include SiGe. In one example, the silicon germanium sacrificial semiconductor layers 120 may include between 20% and 30% germanium, though other concentrations of germanium can be utilized without departing from the scope of the present disclosure. The concentration of germanium in the silicon germanium sacrificial semiconductor layers 120 is selected to be different than the concentration of germanium in a subsequently formed SiGe sacrificial cladding. The compositions of the sacrificial semiconductor layers 120 and the sacrificial cladding are selected to result in different etching characteristics. The purpose and benefits of this will be described in further detail below.

In one embodiment, the semiconductor layers 118 and the sacrificial semiconductor layers 120 are formed by alternating epitaxial growth processes from the semiconductor substrate 102. For example, a first epitaxial growth process may result in the formation of the lowest sacrificial semiconductor layer 120 on the top surface of the substrate 102. A second epitaxial growth process may result in the formation of the lowest sacrificial semiconductor layer 120 on the top surface of the lowest sacrificial semiconductor layer 120. A third epitaxial growth process results in the formation of the second lowest sacrificial semiconductor layer 120 on top of the lowest sacrificial semiconductor layer 120. Alternating epitaxial growth processes are performed until a selected number of semiconductor layers 118 and sacrificial semiconductor layers 120 have been formed.

The vertical thickness of the semiconductor layers 118 can be between 2 nm and 15 nm. The thickness of the sacrificial semiconductor layers 120 can be between 5 nm and 15 nm. Other thicknesses and materials can be utilized for the semiconductor layers 118 and the sacrificial semiconductor layers 120 without departing from the scope of the present disclosure.

As will be set forth in more detail below, the sacrificial semiconductor layers 120 will be patterned to become semiconductor nanosheets of nanosheet transistors. The semiconductor nanosheets will correspond to channel regions of the nanosheet transistors.

In one embodiment, the sacrificial semiconductor layers 120 correspond to a first sacrificial epitaxial semiconductor region having a first semiconductor composition. In subsequent steps, the sacrificial semiconductor layers 120 will be removed and replaced with other materials and structures. For this reason, the semiconductor layers 120 are described as sacrificial.

Figure 2B:
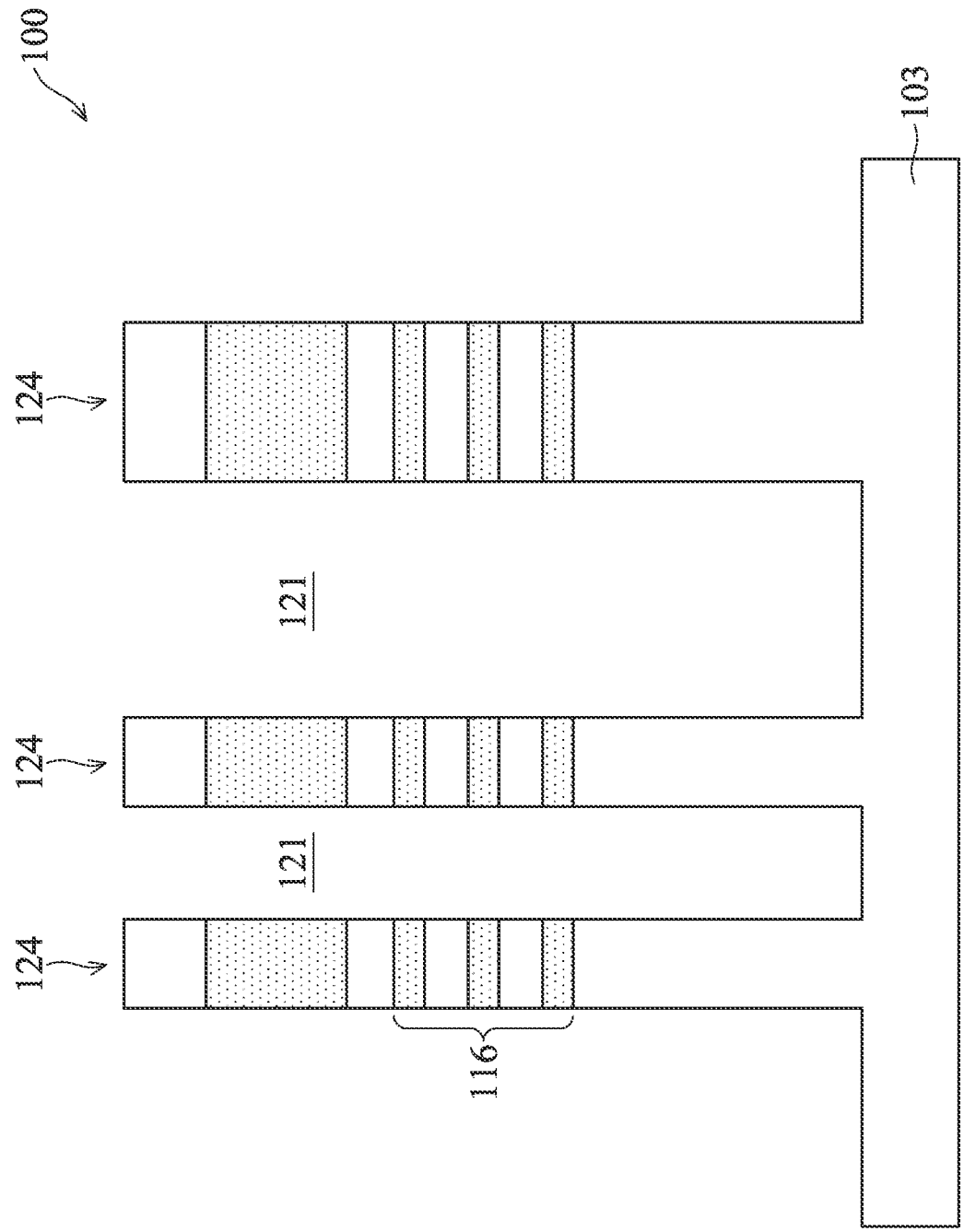

In FIG. 2B, trenches 121 have been formed in the sacrificial semiconductor layers 120, the semiconductor layers 118, and in the substrate 102. The trenches 121 can be formed by depositing a hard mask layer 122 on the top sacrificial semiconductor layer 120. The hard mask layer 122 is patterned and etched using standard photolithography processes. After the hard mask layer 122 has been patterned and etched, the sacrificial semiconductor layers 120, the semiconductor layers 118, and the substrate 102 are etched at the locations that are not covered by the hard mask layer 122. The etching process results in formation of the trenches 121. The etching process can include multiple etching steps. For example, a first etching step can etch the top sacrificial semiconductor nanosheet. A second etching step can etch the top sacrificial semiconductor layer 120. These alternating etching steps can repeat until all of the sacrificial semiconductor layers 120 and semiconductor layers 118 and the etched at the exposed regions. The final etching step may etch the substrate 102. In other embodiments, the trenches 121 may be formed in a single etching process.

The trenches 121 define three fins 124 of semiconductor layers 118 and sacrificial semiconductor layers 120. Each of these fins 124 corresponds to a separate nanosheet transistor that will eventually result from further processing steps described herein. In particular, the semiconductor layers 118 in each column or stack will correspond to the channel regions of a particular nanosheet transistor.

The hard mask layer 122 can include one or more of aluminum, AlO, SiN, or other suitable materials. The hard mask layer 122 can have a thickness between 5 nm and 50 nm. The hard mask layer 122 can be deposited by a PVD process, an ALD process, a CVD process, or other suitable deposition processes. The hard mask layer 122 can have other thicknesses, materials, and deposition processes without departing from the scope of the present disclosure.

Figure 2C:
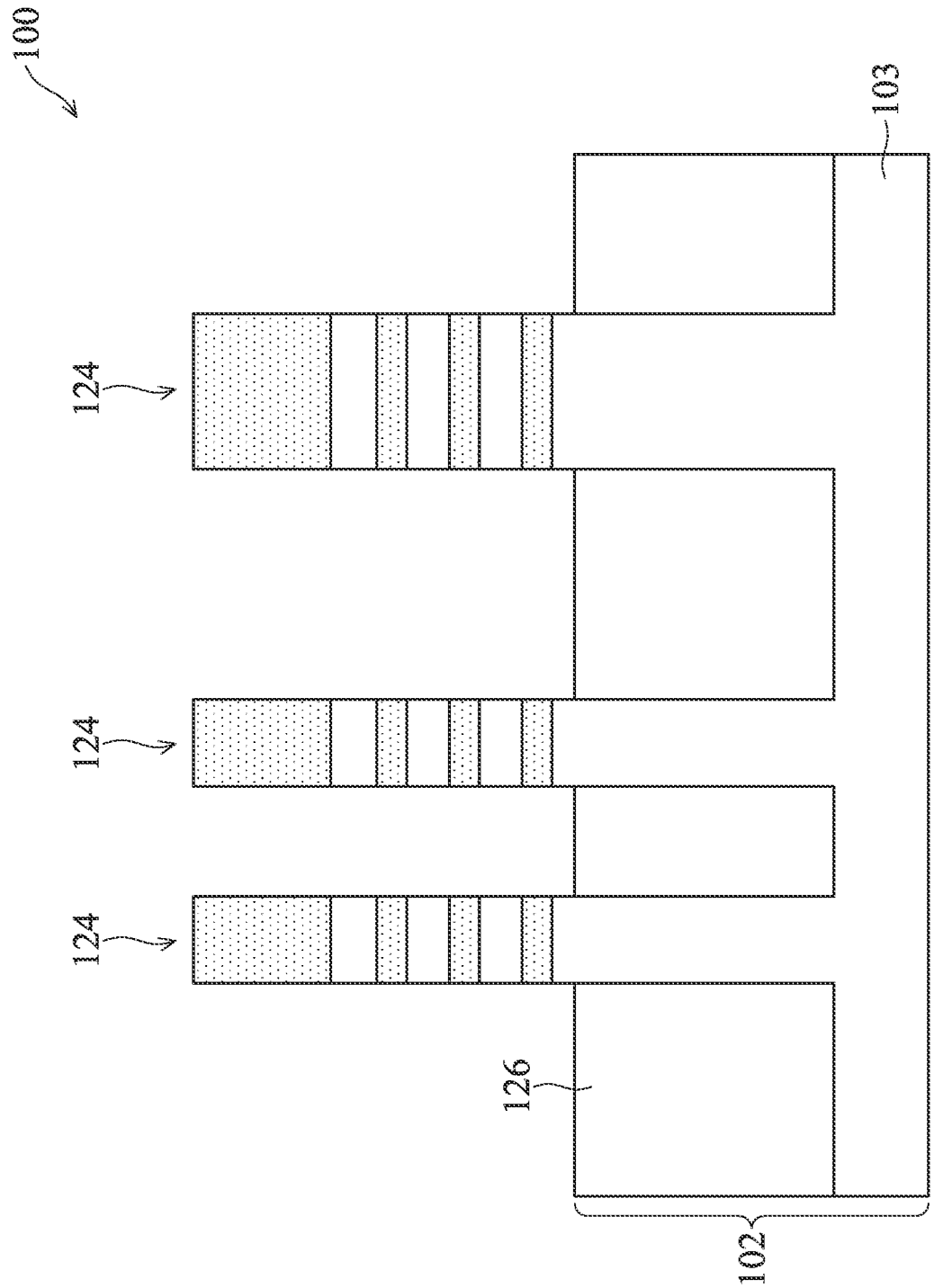

In FIG. 2C, shallow trench isolation regions have been formed in the trenches 121. The shallow trench isolation regions can be formed by depositing a dielectric material in the trenches 121 and by recessing the deposited dielectric material so that a top surface of the dielectric material is lower than the lowest sacrificial semiconductor layer 120. The hard mask 122 has been removed.

The shallow trench isolation regions 126 can be utilized to separate individual transistors or groups of transistors groups of transistors formed in conjunction with the semiconductor substrate 102. The dielectric material for the shallow trench isolation regions 126 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 126 without departing from the scope of the present disclosure. The shallow trench isolation regions 126 may be considered part of the substrate 102.

Figure 2D:
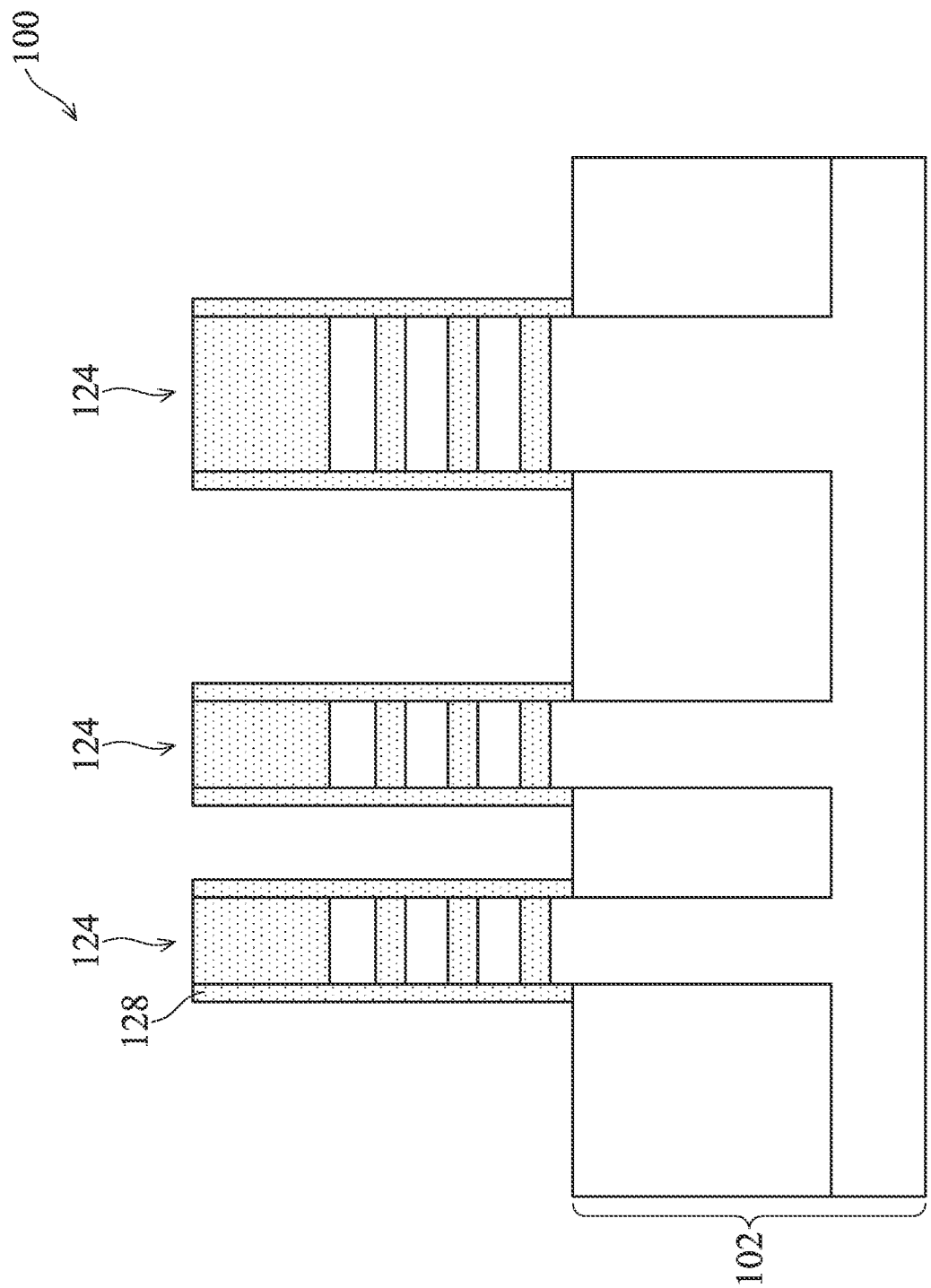

In FIG. 2D, a sacrificial semiconductor cladding 128 has been deposited on the on the sides of the semiconductor layers 118 and the sacrificial semiconductor layers 120. The sacrificial semiconductor cladding 128 can be formed by an epitaxial growth from the semiconductor layers 118, the sacrificial semiconductor layers 120, and the hard mask layer 122. Alternatively, the sacrificial semiconductor cladding 128 can be deposited by a chemical vapor deposition (CVD) process. Other processes can be utilized for depositing the sacrificial semiconductor cladding 128 without departing from the scope of the present disclosure.

Figure 2E:
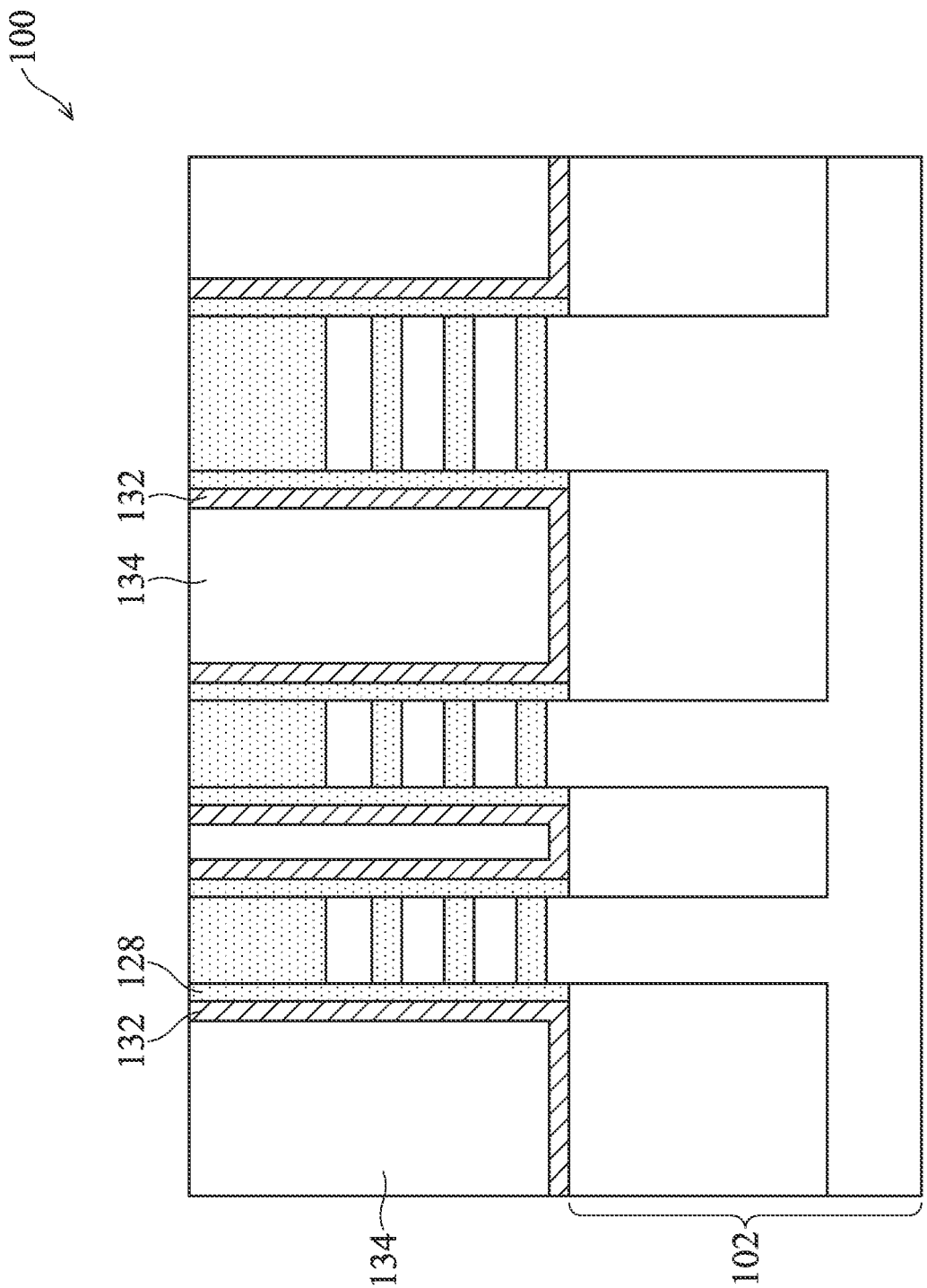

In FIG. 2E, a dielectric layer 132 has been deposited on the sacrificial semiconductor cladding 128 and on exposed surfaces of the shallow trench isolation regions 126. In some embodiments, the dielectric layer 132 can include silicon oxide, though other dielectric materials can be utilized without departing from the scope of the present disclosure. The dielectric layer can be deposited by CVD, ALD, PVD, or other processes.

In FIG. 2E, a dielectric layer 134 has been deposited on the dielectric layer 132. In some embodiments, the dielectric layer 134 can include silicon nitride, though other dielectric materials can be utilized without departing from the scope of the present disclosure. The dielectric layer 134 can be deposited by CVD, ALD, PVD, or other processes.

Figure 2F:
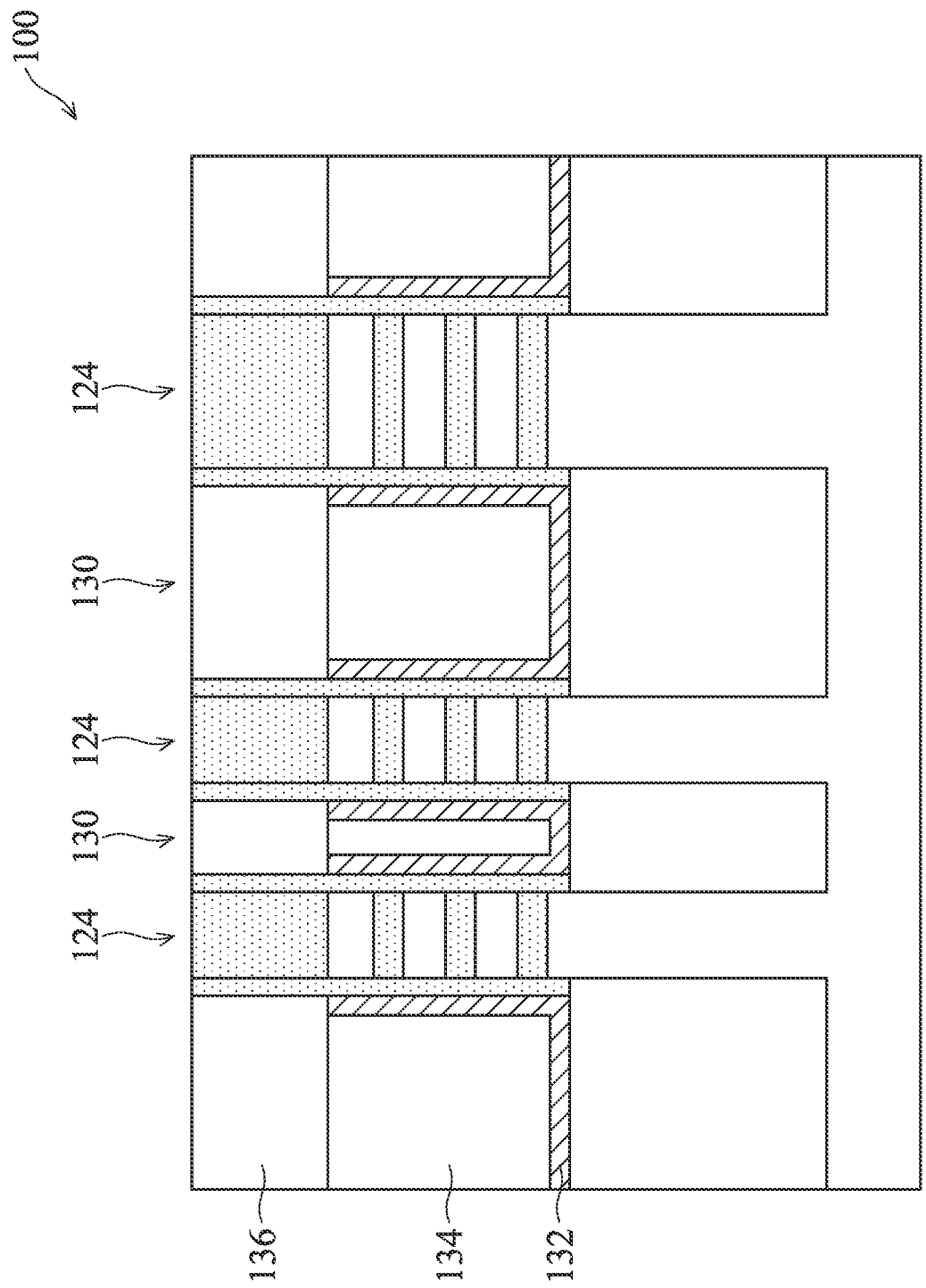

In FIG. 2F an etching process has been performed to recess the top surface of the dielectric layers 132 and 134. In particular, a timed etch is performed to reduce the height of the dielectric layers 132 and 134. The timed etching process can include a wet etch, dry etch, or any suitable etch for recessing the dielectric layers 132 and 134 to a selected depth.

In FIG. 2F, a high-K dielectric layer 136 has been deposited on the dielectric layers 132 and 134. The high-K dielectric layer 136 can include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K dielectric layer 136 may be formed by CVD, ALD, or any suitable method. A planarization process, such as a CMP process, has been performed to planarize the top surface of the high-K dielectric layer 136.

The dielectric layers 132, 134, and 136 collectively form hybrid fin structures 130 between the fins 124. The high-K dielectric layer 136 may be termed a helmet layer of the hybrid fin structures 130. Other processes and materials can be utilized for the high-K dielectric layer 136 without departing from the scope of the present disclosure. Other materials and deposition processes can be utilized to form the hybrid fin structures 130 without departing from the scope of the present disclosure.

Figure 2G:
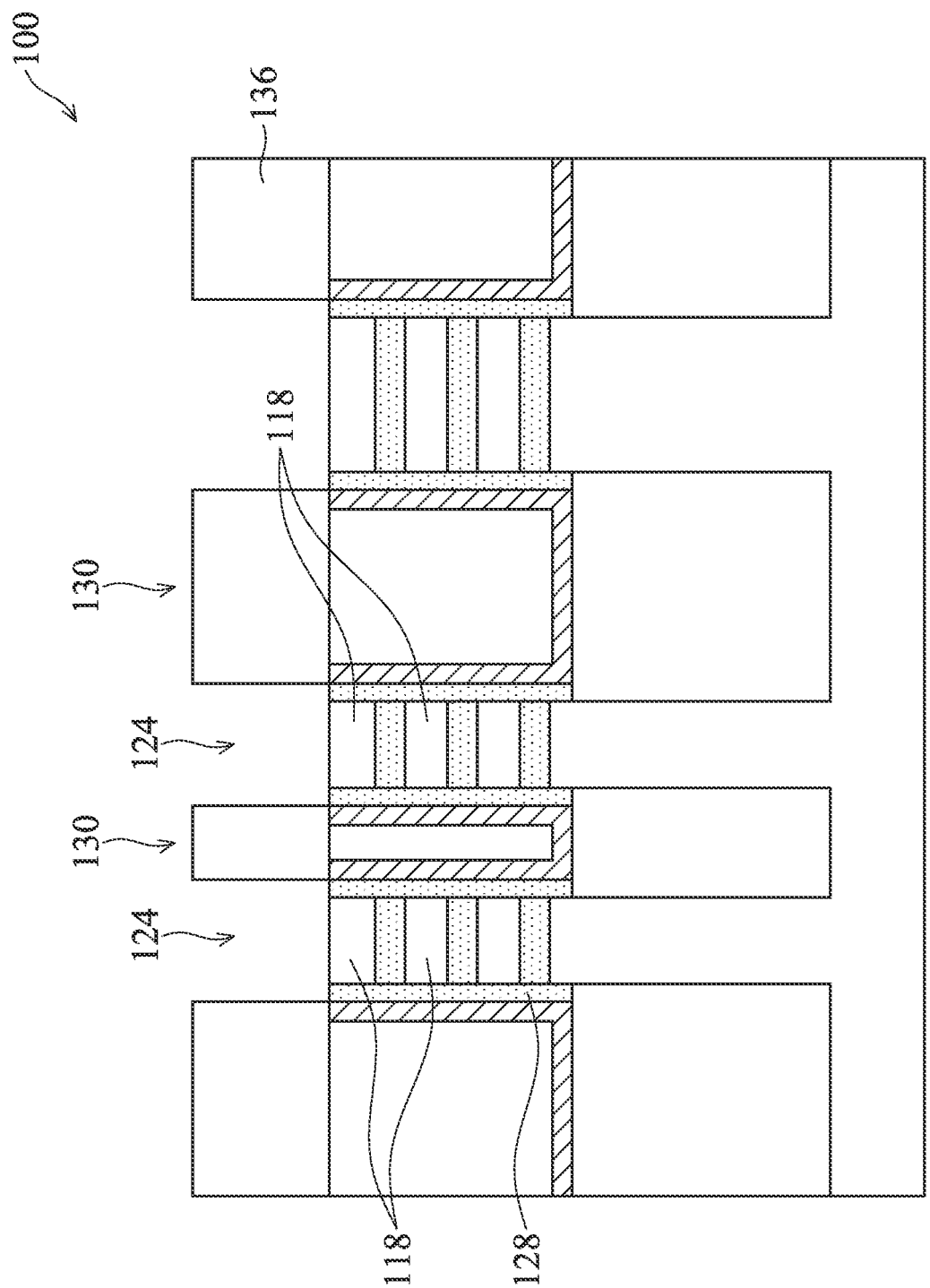

In FIG. 2G an etching process has been performed to recess the sacrificial semiconductor cladding 128 and to remove the top sacrificial semiconductor layer 120 from each semiconductor fin 124. The etching process can be performed in one or more steps. The one or more steps selectively etch the hard mask and the materials of the sacrificial semiconductor cladding 128 and the sacrificial semiconductor layers 120 with respect to the material of the high-K dielectric layer 136. Accordingly, in FIG. 2G the high-K dielectric layer 136 remains protruding above substantially unchanged while other layers have been recessed or removed. The one or more etching steps can include wet etches, dry etches, timed etches, or other types of etching processes.

Figure 2H:
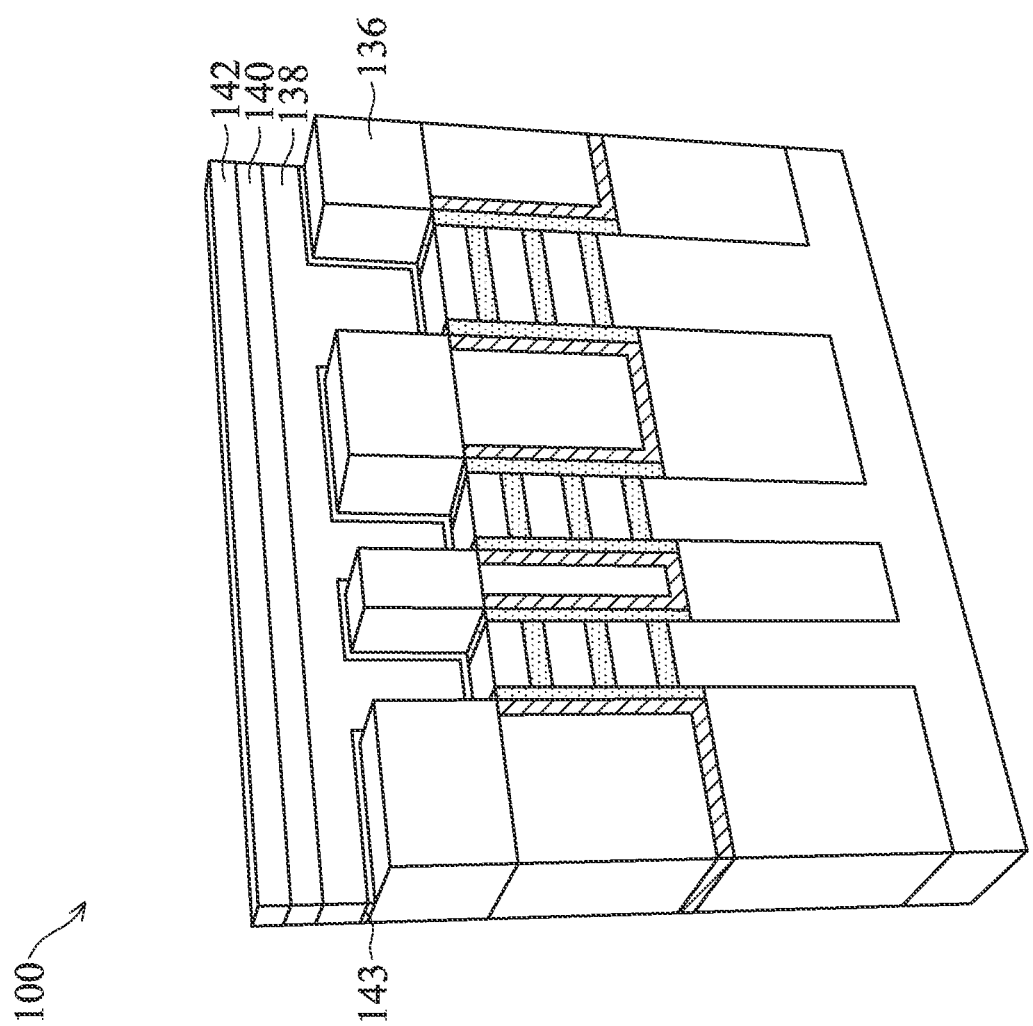
Figure 2I:
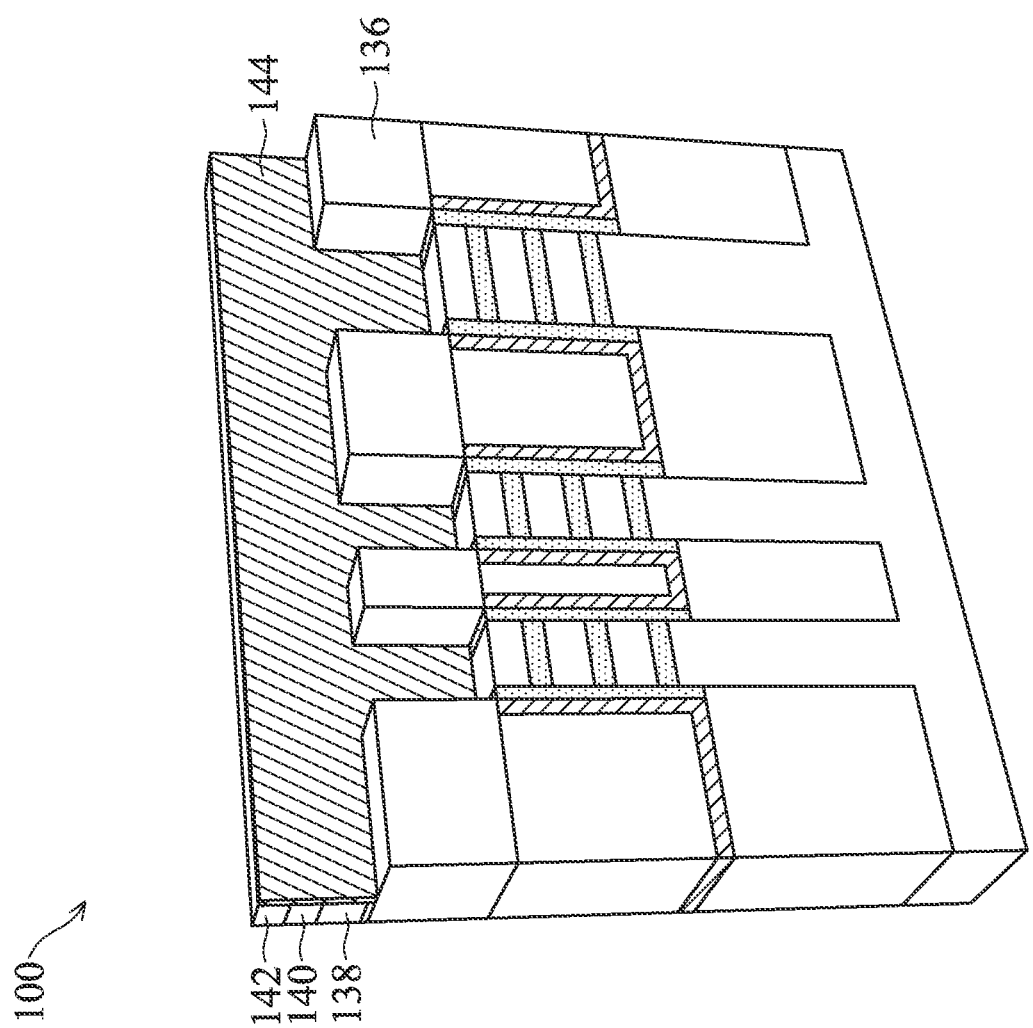

In FIG. 2H a layer of polysilicon 138 has been deposited on the top surfaces of the sacrificial semiconductor cladding 128, the top sacrificial semiconductor layer 120, and on the high-K dielectric layer 136. The layer of polysilicon 138 can have a thickness between 20 nm and 100 nm. The layer polysilicon 138 can be deposited by an epitaxial growth, a CVD process, a physical vapor deposition (PVD) process, or an ALD process. Other thicknesses and deposition processes can be used for depositing the layer polysilicon 138 without departing from the scope of the present disclosure.

In FIG. 2H a dielectric layer 140 has been deposited on the layer of polysilicon 138. A dielectric layer 142 has been formed on the dielectric layer 140. In one example, the dielectric layer 142 includes silicon oxide, silicon nitride, silicon oxynitride, silicon carbide, or silicon carbonitride. In one example, the dielectric layer 140 includes silicon nitride. 144 may be termed a poly spacer layer. After deposition of the poly spacer layer 144, the poly spacer layer 144 is etched by an anisotropic etching process that removes the poly spacer layer 144 from the top surfaces of the dielectric layer 142, from the top surfaces of the high-K dielectric layer 136, and from the top surfaces of the uppermost semiconductor nanosheets 118. This leaves the structure shown in FIG. 2I. In practice, the spacer layer may include multiple individual spacer layers. Accordingly, the spacer layer 144 can include other structures and layers without departing from the scope of the present disclosure.

The gate spacer layer 144 acts as a mask for etching portions of the sacrificial semiconductor cladding 128, the semiconductor layers 118, and the sacrificial semiconductor layers 120 in preparation for depositing source and drain regions as will be set forth in further detail below.

Figure 2J:
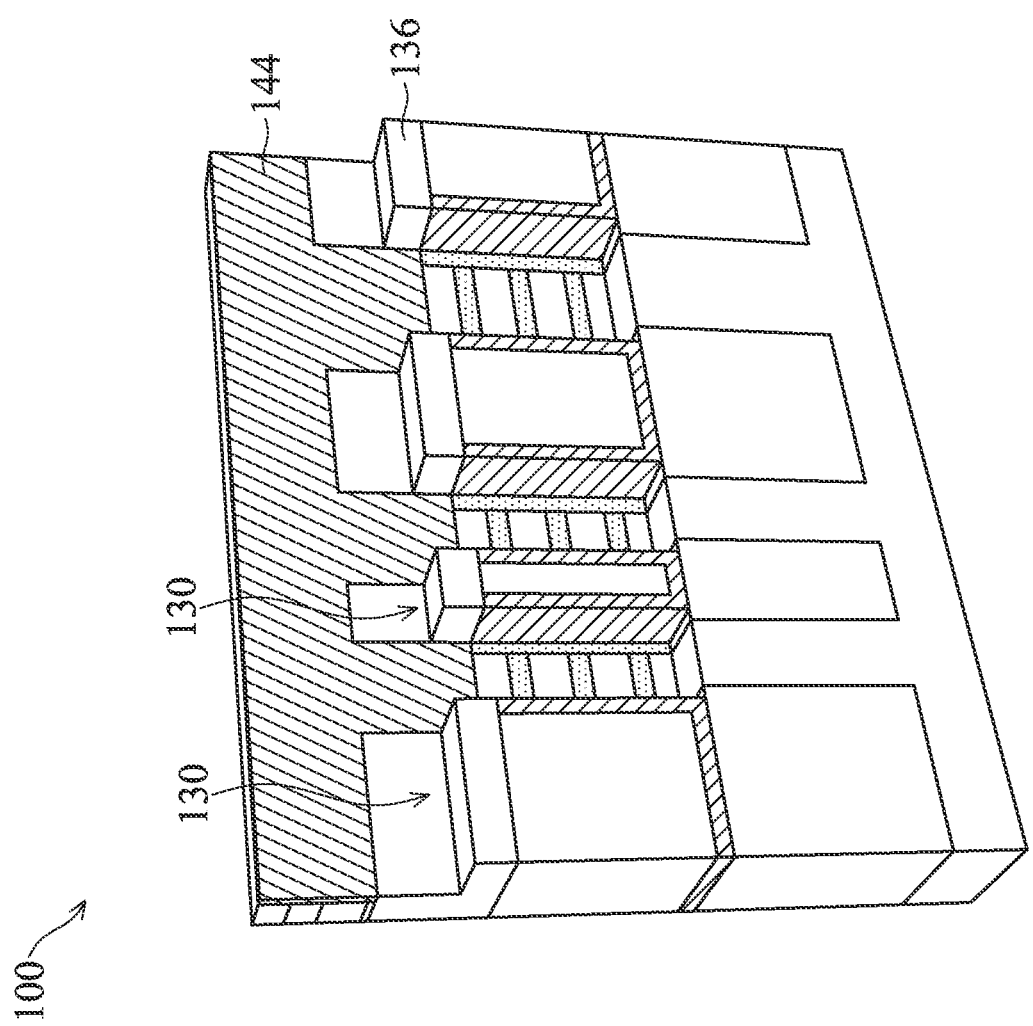

In FIG. 2J, an anisotropic etching process is performed that selectively etches in the downward direction. The portions of the sacrificial semiconductor cladding 128, the semiconductor layers 118, and the sacrificial semiconductor layers 120 that are not directly below the gate spacer layer 144 and the polysilicon 138 are etched. The result is that a portion of the shallow trench isolation regions 126 and the substrate 102 are exposed.

The high-K dielectric layer 136 is etched at a comparatively slow rate with respect to the various semiconductor layers. The result is that only about half of the exposed high-K dielectric layer 136 is etched. Accordingly, the dielectric layers 132 and 134 below the high-K dielectric 136 are not substantially etched during the etching process.

Figure 2K:
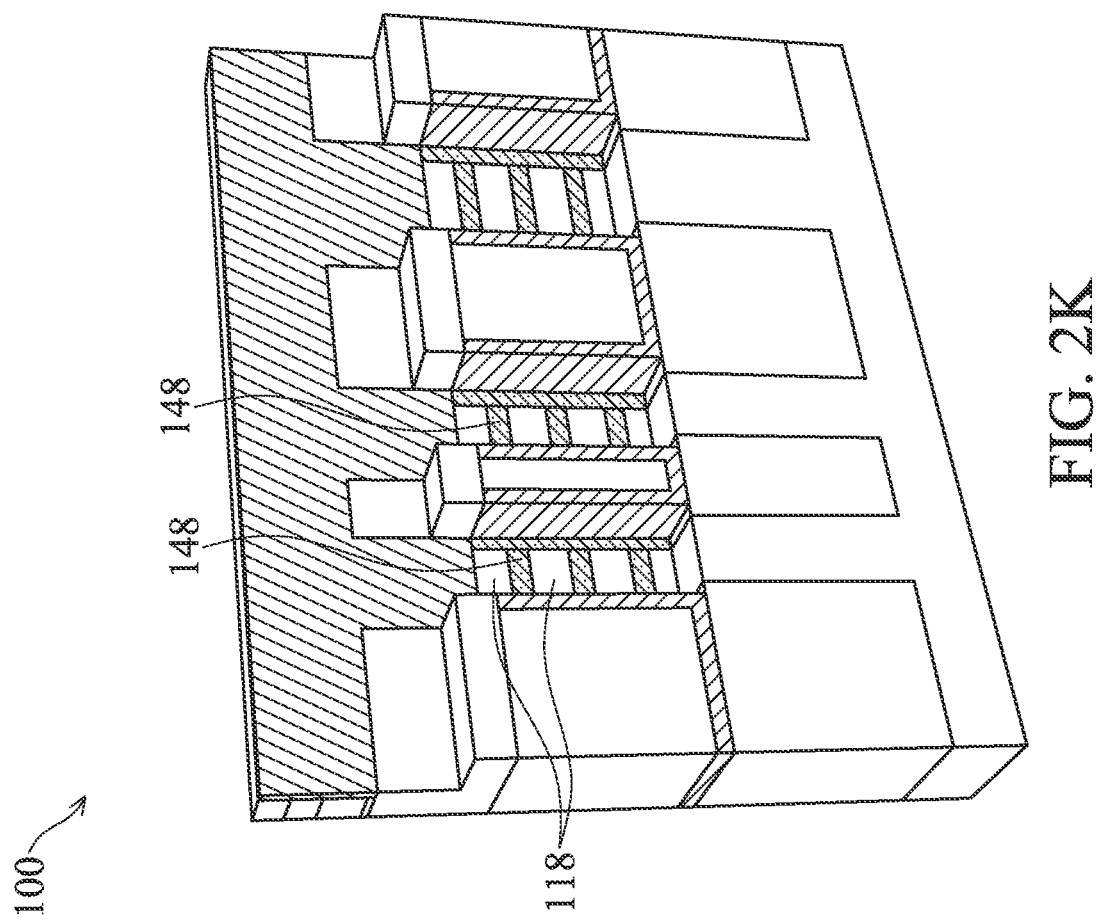

In FIG. 2K an etching process has been performed to recess the sacrificial semiconductor cladding 128 and the sacrificial semiconductor layers 120 with respect to the semiconductor layers 118. The etching process can be performed by a chemical bath that selectively etches the sacrificial semiconductor cladding 128 and sacrificial semiconductor channels 120 with respect to the semiconductor layers 118.

In FIG. 2K an inner spacer layer 148 has been deposited between the semiconductor layers 118 in the recesses formed by partial removal of the sacrificial semiconductor layers 120. The inner spacer layer 148 has also been formed in the recesses formed by partial removal of the sacrificial semiconductor cladding 128. The inner spacer layer 148 can be deposited by an ALD process, a CVD process, or other suitable processes. In one example, the inner spacer layer 148 includes silicon nitride. After deposition of the inner spacer layer 148, an etching process is performed utilizing the gate spacer layer 144 as a mask. The etching process removes the inner spacer layer 148 except directly below the gate spacer layer 144.

Figure 2L:
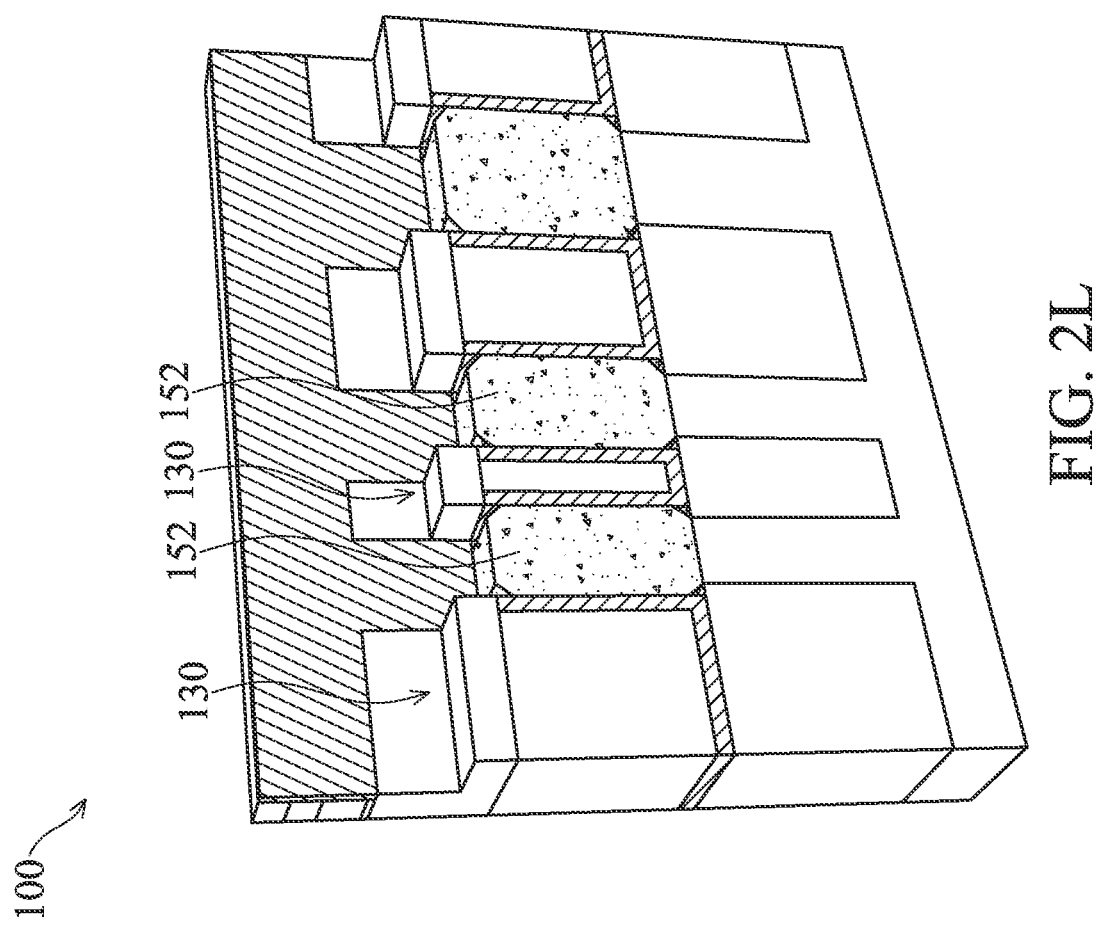

In FIG. 2L source/drain regions 152 have been formed. The source/drain regions 152 includes semiconductor material. The source/drain regions 152 can be grown epitaxially from the semiconductor layers 118. The source/drain regions 152 can be epitaxially grown from the semiconductor layers 118 or from the substrate 102. The source/drain regions 152 can be doped with N-type dopants species in the case of N-type transistors. The source/drain regions 152 can be doped with P-type dopant species in the case of P-type transistors. The doping can be performed in-situ during the epitaxial growth. The hybrid fin structures 130 can act as electrical isolation between the source/drain regions 152 of adjacent transistors.

Figure 2M:
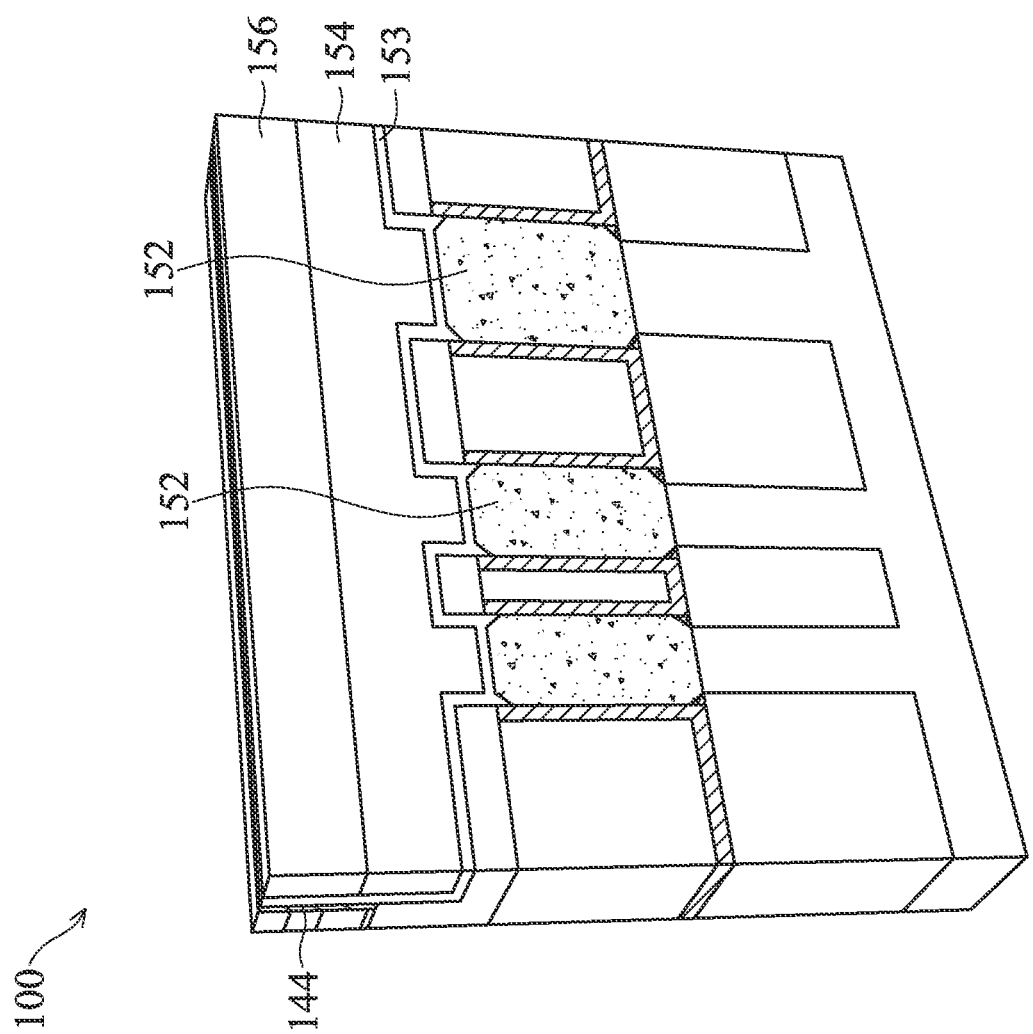

In FIG. 2M a dielectric layer 153 has been deposited on the source/drain regions 152 and on the high-K dielectric layer 136. The dielectric layer 153 can include silicon nitride or SiCON. The dielectric layer 153 can be deposited by CVD, ALD, or other suitable processes. In an interlevel dielectric layer 154 has been deposited on the dielectric layer 153. The interlevel dielectric layer 154 can include silicon oxide. The interlevel dielectric layer 154 can be deposited by CVD, ALD, or other suitable processes. A dielectric layer 156 has been deposited on the dielectric layer 154, can include silicon nitride, and can be deposited by ALD, CVD, or PVD. Other materials and processes can be utilized for the dielectric layers 153, 154, and 156 without departing from the scope of the present disclosure.

Figure 2N:
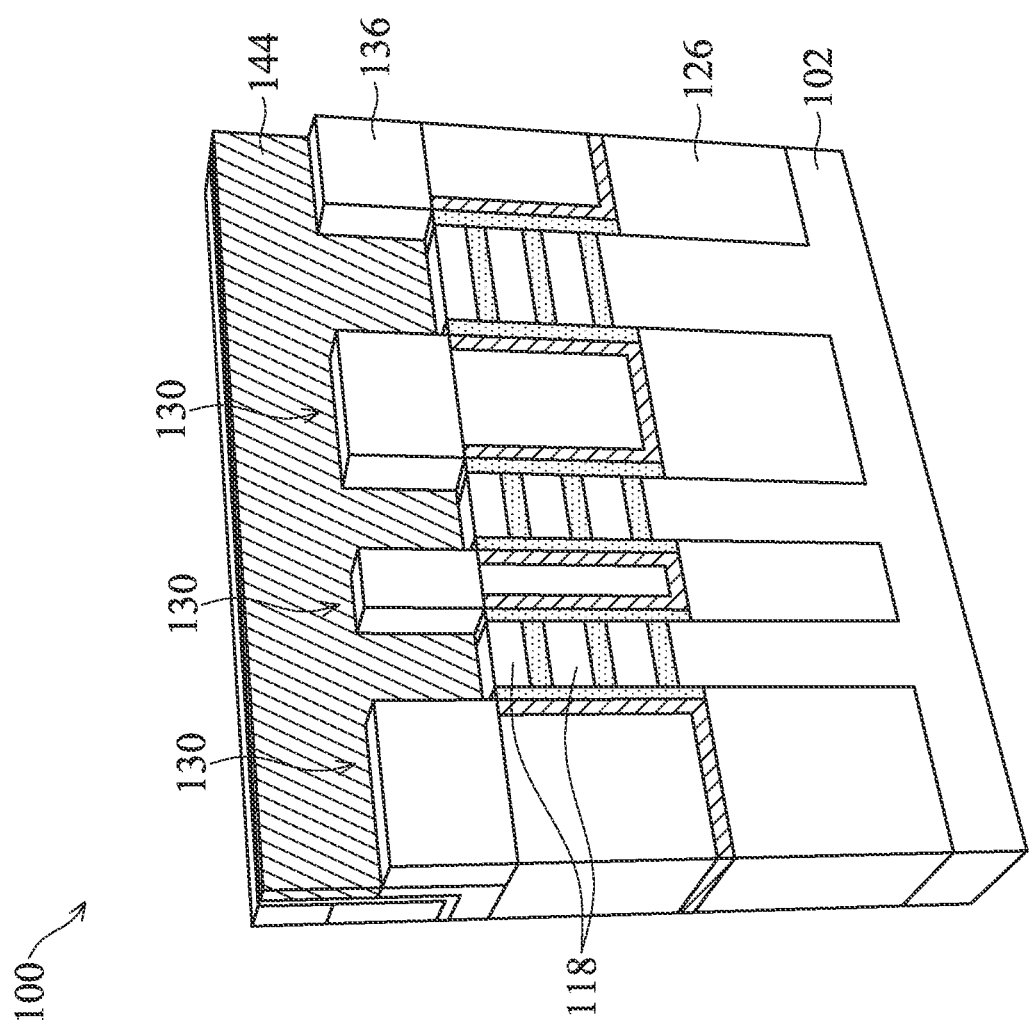

In FIG. 2N, the view has been shifted from FIG. 2M so that the source/drain regions 152 are in the foreground and are no longer visible. The dielectric layers 138, 140, and 142 have been removed by one or more etching processes. Put another way, the cross-section of FIG. 2N is taken between the gate spacers 144 of the dummy gate structures of which the polysilicon 138 is part and of which the dielectric layers 142 and 140 were previously part. The sacrificial semiconductor layers 120 and the sacrificial semiconductor cladding 128 are visible in the view of FIG. 2N because they were not entirely removed in FIG. 2K, but were merely recessed.

Figure 2O:
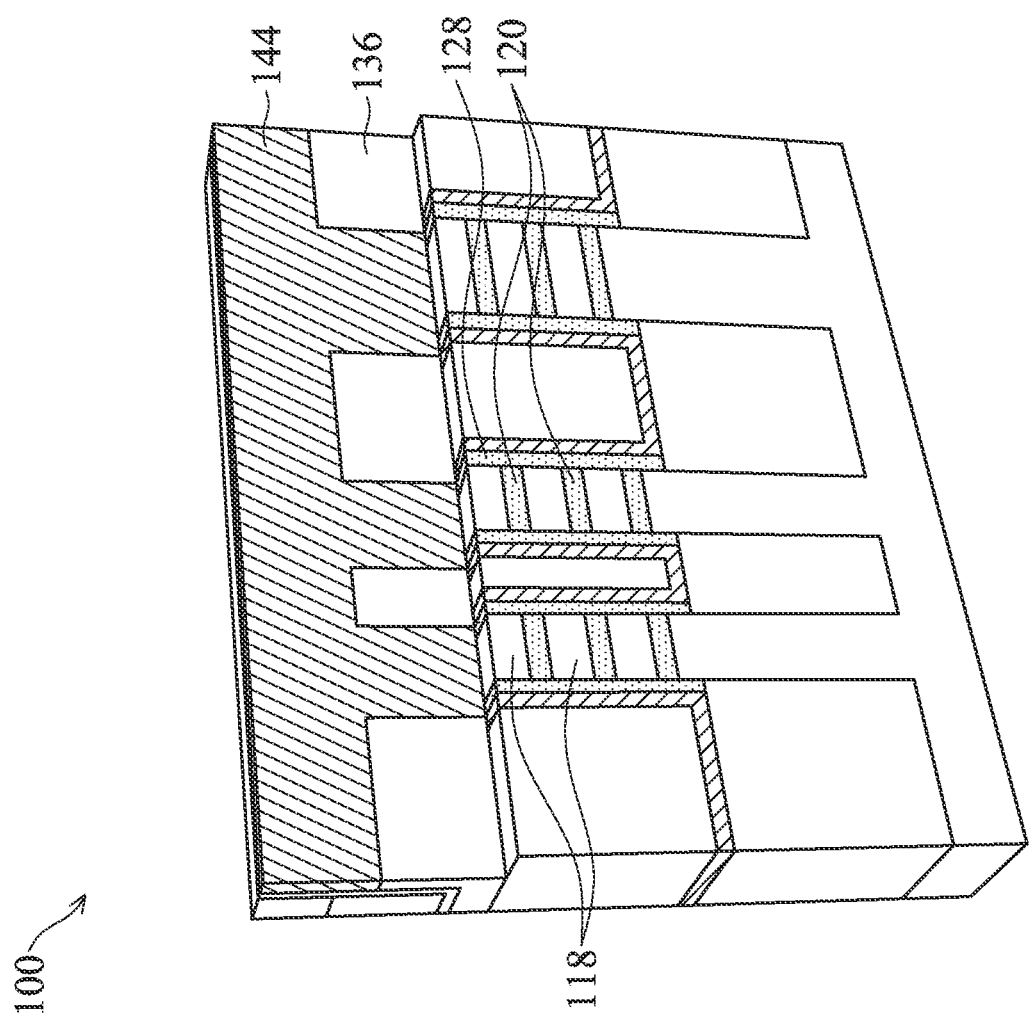

In FIG. 2O, the remainder of the dummy gate structure has been removed. This corresponds to removal of the polysilicon 136 from above the hybrid fin structures 130. The high-K dielectric layer 136 can be removed from above the hybrid fin structures 130 via one or more etching process including wet etches, dry etches, or other types of etching processes.

Figure 2P:
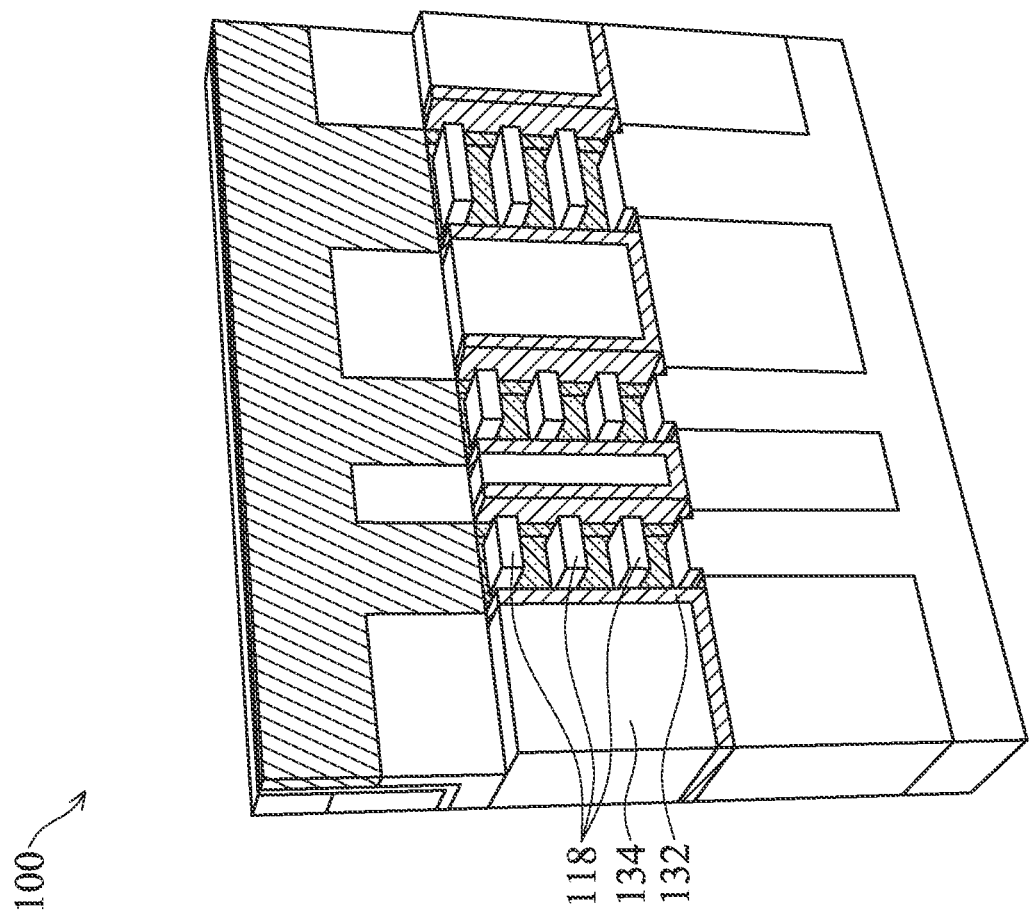

In FIG. 2P, the sacrificial semiconductor layers 120 and the sacrificial semiconductor cladding 128 have been removed. The sacrificial semiconductor layer 120 and the sacrificial semiconductor cladding 128 can be removed with an etching process that selectively etches the sacrificial semiconductor layers 120 and cladding 128 with respect to the material of the semiconductor layers 118.

Figure 2Q:
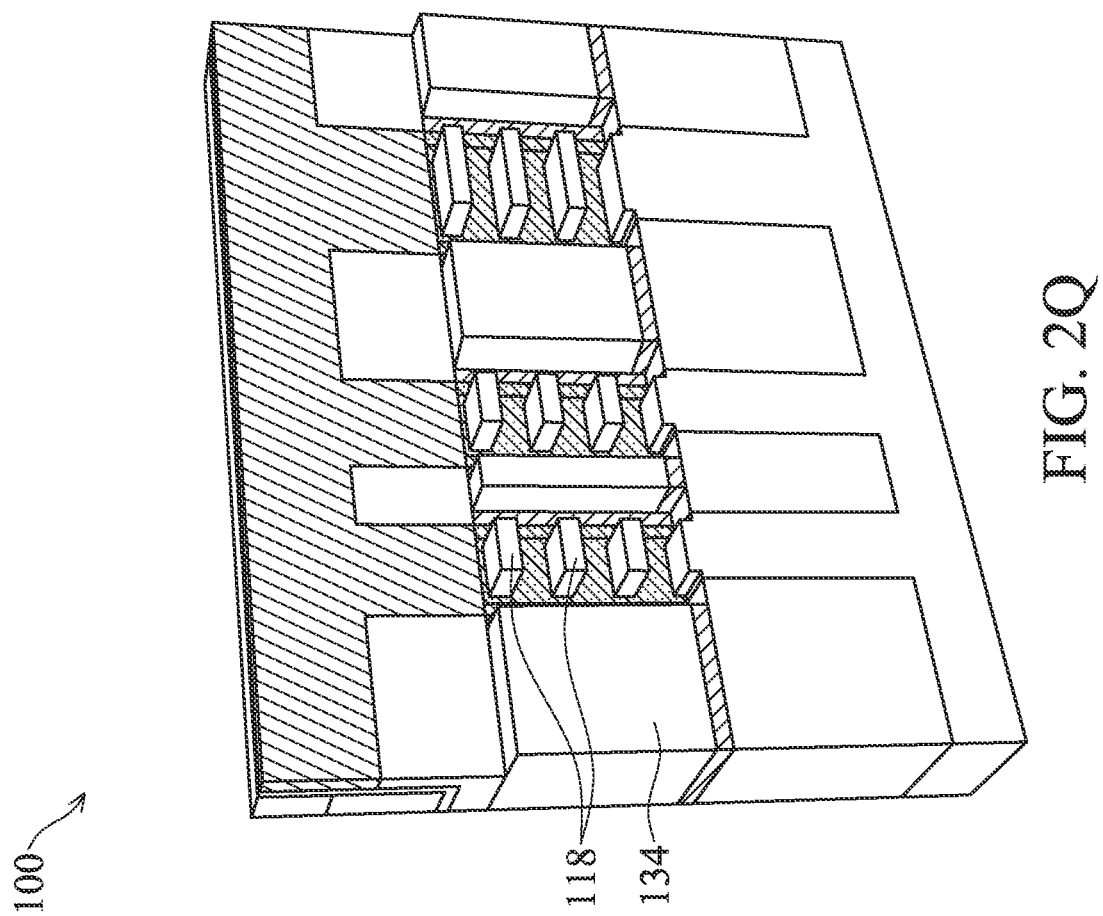

In FIG. 2Q, the vertical portion of the dielectric layer 132 has been removed adjacent to the semiconductor nanosheets 118. The etching process includes an anisotropic etching process that etches in the downward direction. The anisotropic etching process etches selectively in the downward direction. The dielectric layer 134 acts as a mask for etching the dielectric layer 132. Accordingly, the portions of the dielectric layer 132 exposed by the dielectric layer 134 are removed by the etching process in FIG. 2Q.

The removal of the vertical portions of the dielectric layer 132 can have various benefits. For example, the removal of the vertical portions of the dielectric layer 132 effectively widens the area in with the gate electrode will be deposited around the semiconductor nanosheets 118. The widening of the gate electrode area helps to maintain high conductivity of the gate electrode after forming backside trenches to cut the gate electrode, as will be set forth in more detail below.

After the etching process, the semiconductor layers 118 are no longer covered by sacrificial semiconductor structures. Gate dielectric and gate metal structures can now be formed around the semiconductor layers 118 as will be described with reference to subsequent figures. As described previously, the inner spacer layer 148, the source/drain regions 152, and the dielectric layers 153, 154, and 156 are still present in the foreground, though they are not shown in FIG. 2P, for clarity in illustrating the removal of the sacrificial semiconductor layers 120 and cladding 128.

Figure 2R:
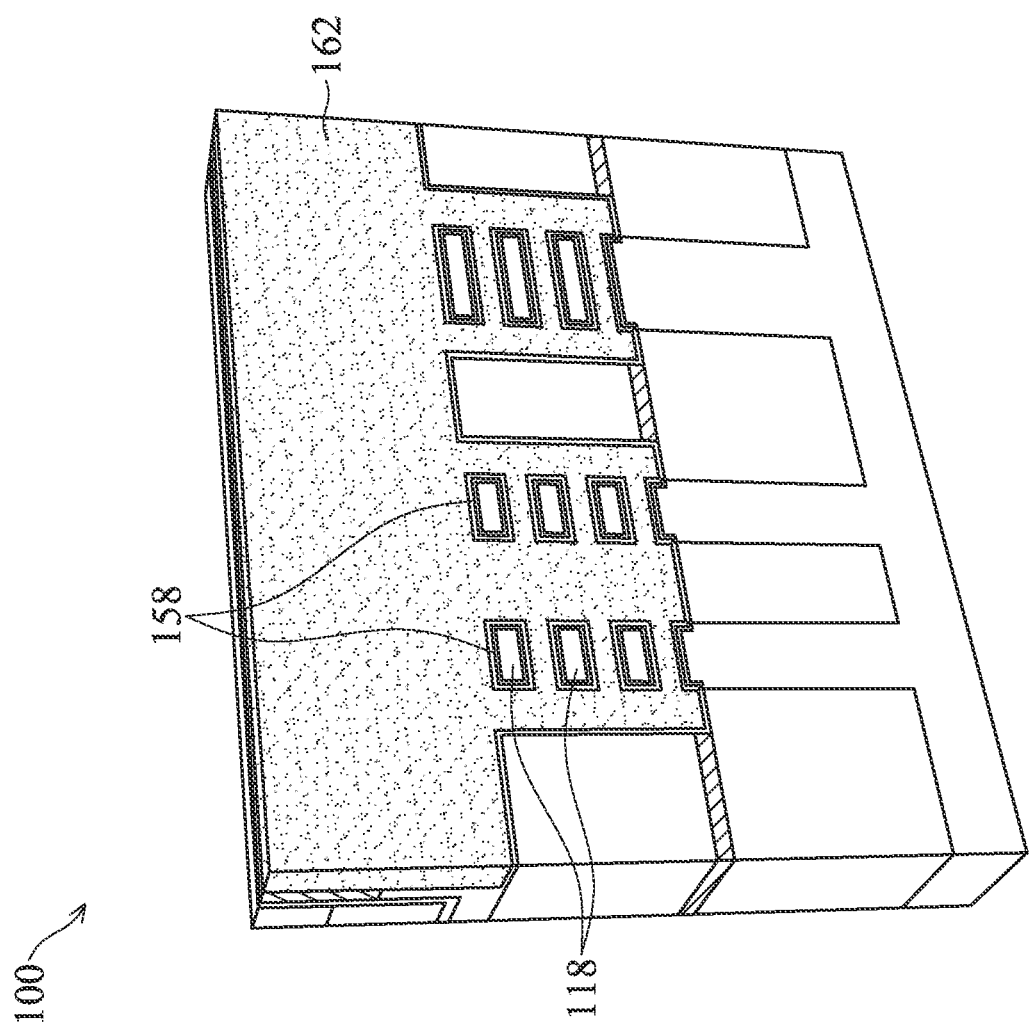

In FIG. 2R, an etching process is performed to remove portions of the dielectric layer 134. In particular, an etching process is performed that etches in the horizontal direction. This process results in the entire removal of the narrower portions of the dielectric layer 134 between sets of nanosheets 118. The narrower portions of the dielectric layer 134 may have a width between 20 nm and 30 nm prior to removal. This process also results in reducing the width of the wider portions of the dielectric layer 134 between sets of nanosheets 118.

In FIG. 2R a gate dielectric 158 has been deposited on the exposed surfaces of the semiconductor layers 118. The gate dielectric 158 is shown as only a single layer, in practice, the gate dielectric 158 may include multiple dielectric layers. For example, the gate dielectric 158 may include an interfacial dielectric layer that is in direct contact with the semiconductor layers 118. The gate dielectric 158 may include a high-K gate dielectric layer positioned on the interfacial dielectric layer. Together, the interfacial dielectric layer and the high-K gate dielectric layer form a gate dielectric for the nanosheet transistors.

The interfacial dielectric layer can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The interfacial dielectric layer can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the semiconductor layers 118 for gate metals, as will be explained in more detail below. Other materials, deposition processes, and thicknesses can be utilized for the interfacial dielectric layer without departing from the scope of the present disclosure.

The high-K gate dielectric layer and the interfacial dielectric layer physically separate the semiconductor layers 118 from the gate metals that will be deposited in subsequent steps. The high-K gate dielectric layer and the interfacial dielectric layer isolate the gate metals from the semiconductor layers 118 that correspond to the channel regions of the transistors.

The high-K gate dielectric layer includes one or more layers of a dielectric material, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer may be formed by CVD, ALD, or any suitable method. In one embodiment, the high-K gate dielectric layer is formed using a highly conformal deposition process such as ALD in order to ensure the formation of a gate dielectric layer having a uniform thickness around each semiconductor layer 118. In one embodiment, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes $HfO_2$ with dipole doping including La and Mg, and a second layer including a higher-K ZrO layer with crystallization.

After deposition of the gate dielectric 158, a gate metal 162 is deposited. The gate metal 162 surrounds the semiconductor layers 118. In particular, the gate metal 162 is in contact with the gate dielectric 158. The gate metal 162 is positioned between semiconductor layers 118. In other words, the gate metal 162 is positioned all around the semiconductor layers 118. For this reason, the transistors formed in relation to the semiconductor layers 118 may be called gate all around transistors.

Although the gate metal 162 is shown as a single metal layer, and practice the gate metal 162 may include multiple metal layers. For example, the gate metal 162 may include one or more very thin work function layers in contact with the gate dielectric 158. The thin work function layers can include titanium nitride, tantalum nitride, or other conductive materials suitable for providing a selected work function for the transistors. The gate metal 162 can further include a gate fill material that corresponds to the majority of the gate metal 162. The gate fill material can include cobalt, tungsten, aluminum, or other suitable conductive materials. The layers of the gate metal 162 can be deposited by PVD, ALD, CVD, or other suitable deposition processes.

Figure 2S:
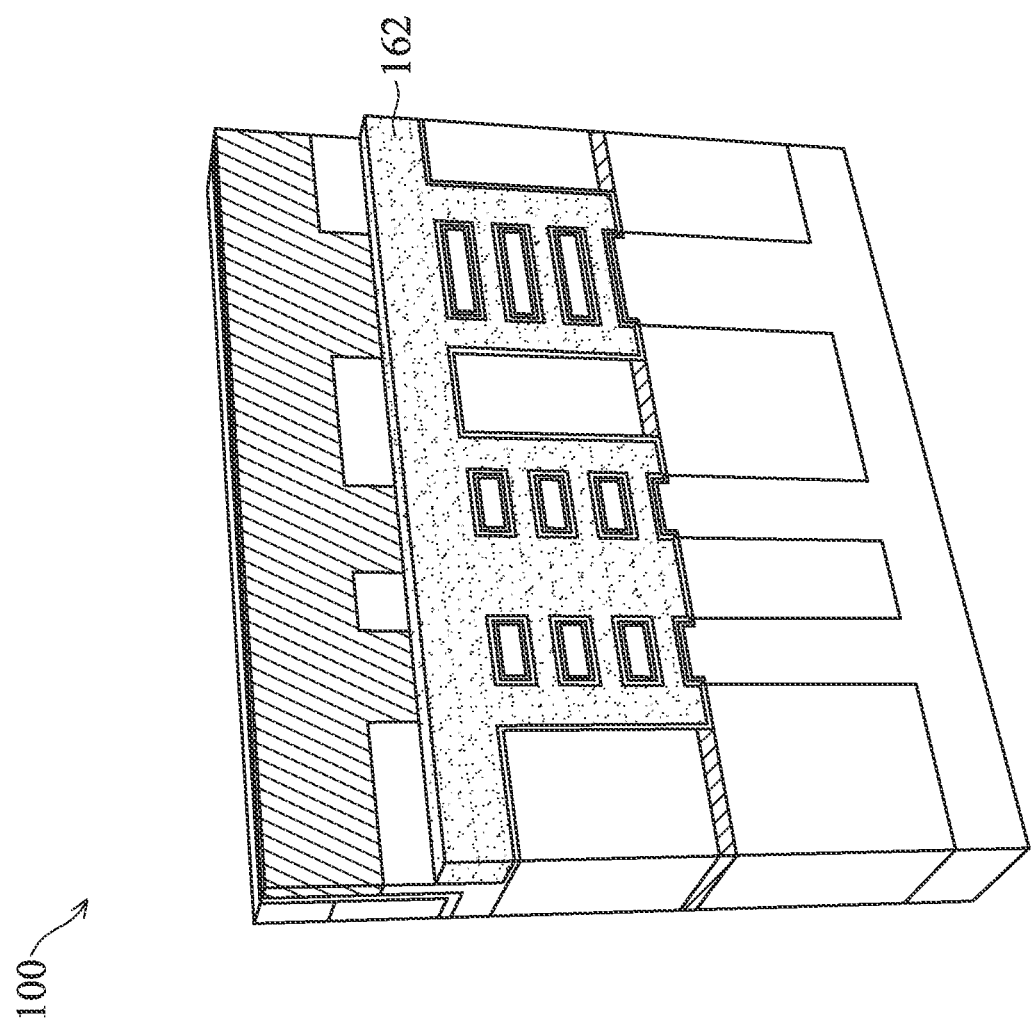

In FIG. 2S, an etching process has been performed to recess the gate metal 162. The recess process can include a timed etching process to reduce the height of the gate metal 162.

Figure 2T:
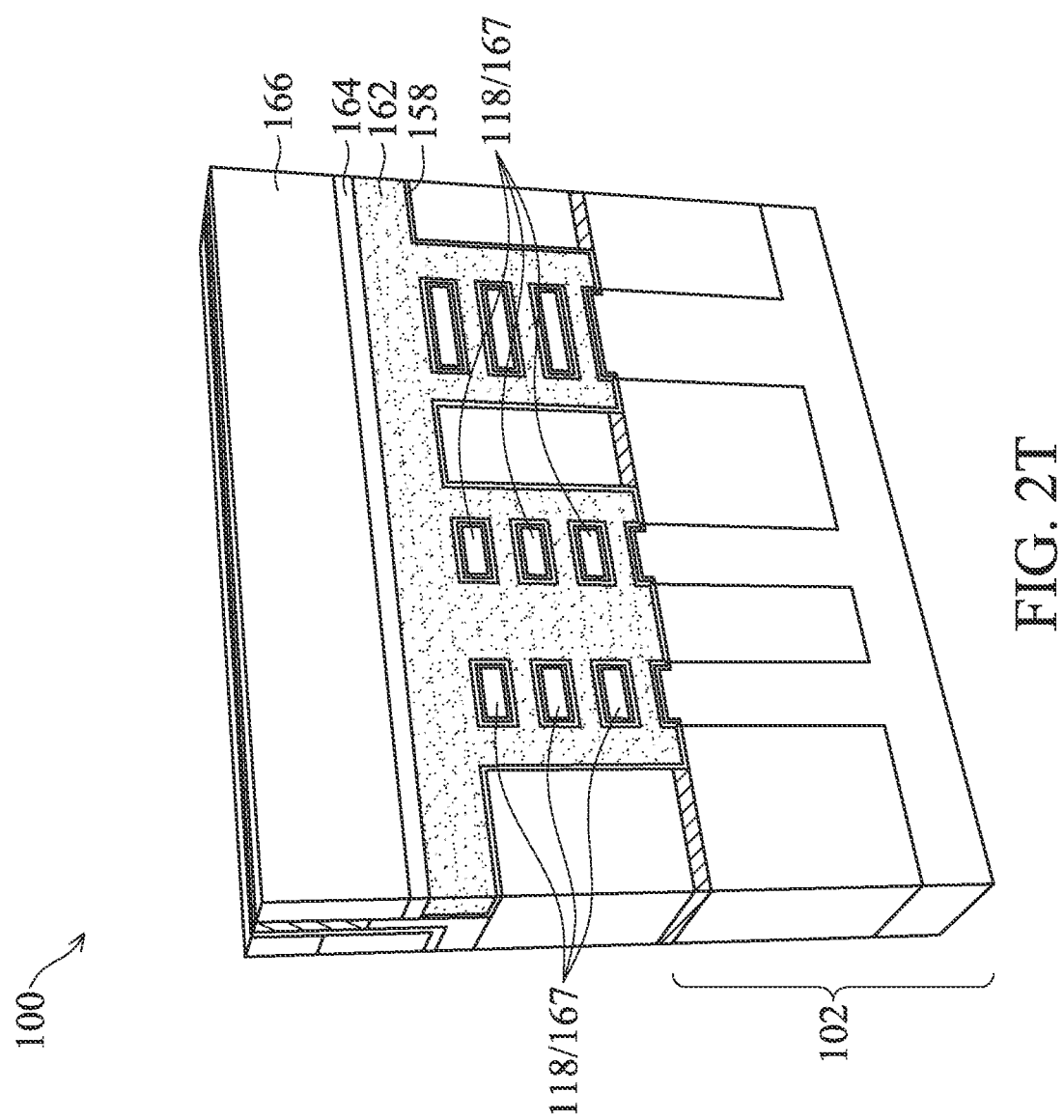

In FIG. 2T a gate metal 164 has been deposited on top of the gate metal 162. The gate metals 162 and 164 may collectively be turned a metal gate. The gate metal 164 can include tungsten, tantalum, titanium, aluminum, gold, copper, or other conductive materials. The gate metal 164 can be deposited by ALD, PVD, or CVD and may have a thickness between 5 nm and 50 nm. Other materials, deposition processes, and thicknesses can be utilized for the gate metal 164 without departing from the scope of the present disclosure.

In FIG. 2T a cap layer 166 has been deposited on top of the gate metal 162. The cap 150 layer can include one or more of SiCN, SiN, or SICON. The cap layer 166 can be deposited by CVD, ALD, or PVD and may have a thickness between 10 nm and 100 nm. Other materials, deposition processes, and thicknesses may be utilized for the cap layer 166 without departing from the scope of the present disclosure.

At the stage of processing shown in FIG. 2T, three nanosheet transistors have been formed. There are three sets of semiconductor channels 167. Each set of semiconductor channels 167 corresponds to the channel region of a respective nanosheet transistor. Each set of channels 167 corresponds to the remaining portions of the semiconductor layer 118. The gate metal 162 surrounds the channels 167. At the stage of processing shown in FIG. 2T, gate electrodes of the transistors are not electrically or physically separated from each other. Instead, the gate terminals are shorted together because the gate metals 162 and 164 are contiguous.

Figure 2U:
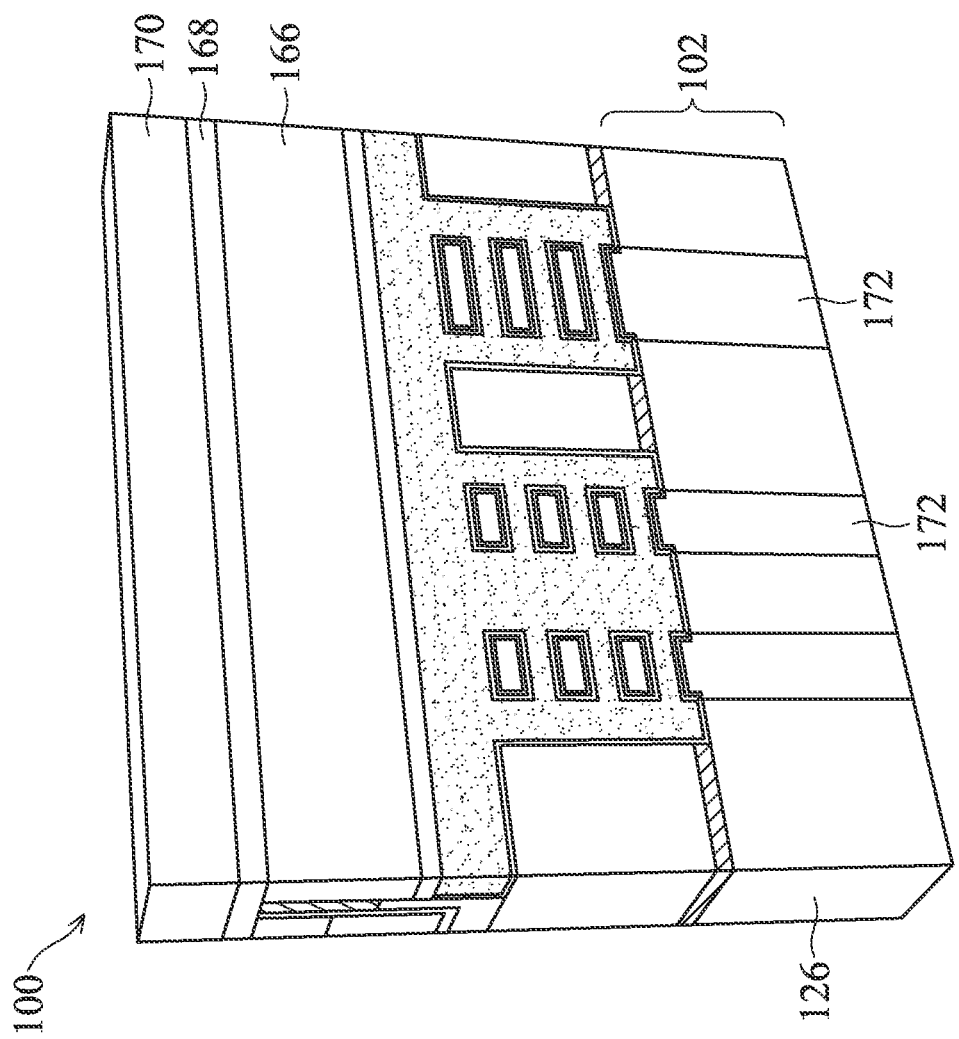

In FIG. 2U, an adhesive layer 168 has been formed on the cap layer 166. A carrier wafer 170 has been attached to the integrated circuit 100. In particular, the carrier wafer 170 has been attached to the integrated circuit 100 via the adhesive layer 168. The carrier wafer 170 can include a semiconductor wafer, the dielectric wafer, or other types of wafers. The attachment of the carrier wafer 170 enables separation of the gate electrodes of the various transistors of the integrated circuit 100, as will be set forth in further below.

In FIG. 2U, the substrate 102 has been thinned. In particular, after attachment of the carrier wafer 170, the integrated circuit 100 can be flipped so that the back surface of the substrate 102 is facing upward and is exposed. The back surface of the substrate 102 corresponds to the surface of the substrate 102 furthest away from the carrier wafer 170. A grinding process is performed to reduce the thickness of the substrate 102. The semiconductor material 103 is removed except directly below the channels 167. After the grinding processes been performed to reduce the thickness of the substrate 102, the remaining portions of the semiconductor material 103 are removed from below the channels 167 by an etching process that selectively etches the semiconductor material 103 with respect to the shallow trench isolation material 126. After removal of the semiconductor material 103, dielectric fin structure 172 have been formed by depositing a dielectric material is deposited in place of the semiconductor material 103. The dielectric material of the dielectric fin structures 172 can include SiCN or silicon oxide nitride and can be deposited by CVD, ALD, or PVD. Other materials and deposition processes can be utilized for the dielectric material of the dielectric fin structures 172.

Figure 2V:
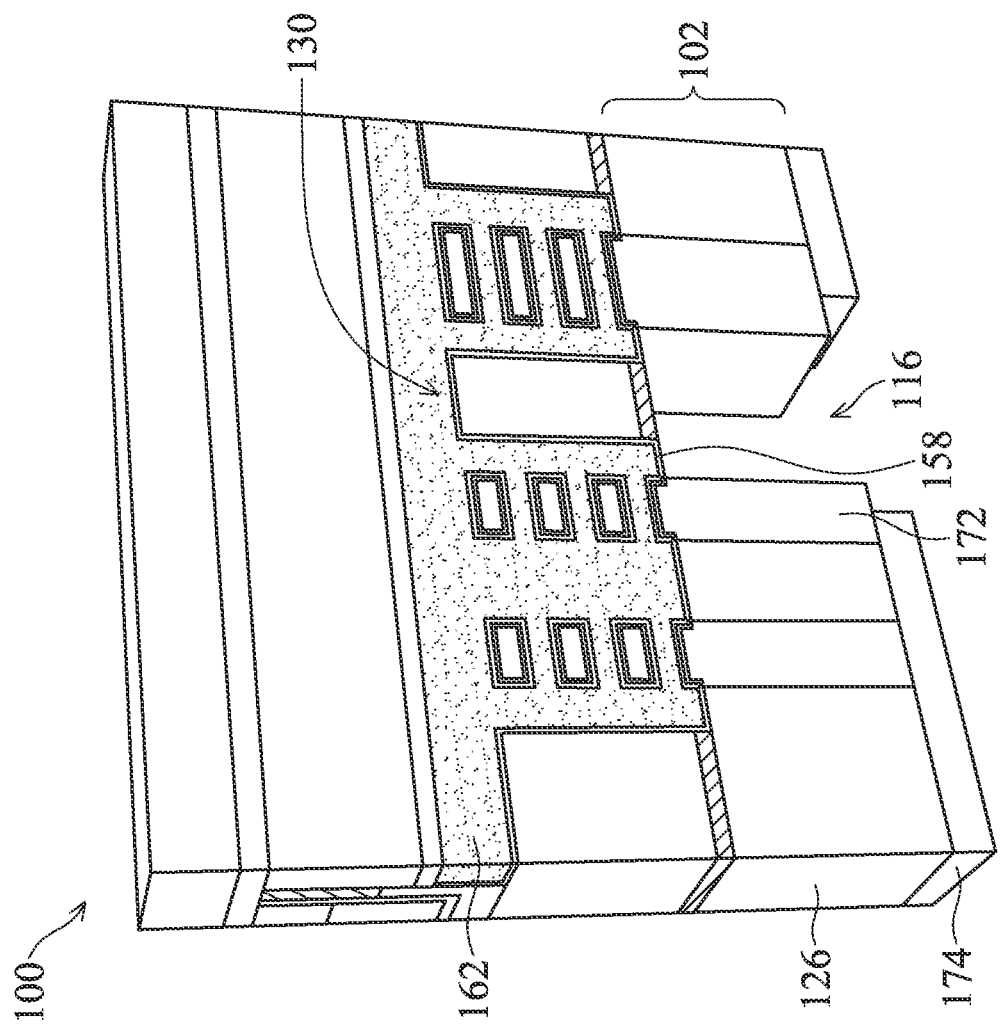

In FIG. 2V, a mask 174 has been formed on the backside of the substrate 102. The mask 174 has been patterned to expose the shallow trench isolation material 126 below the hybrid fin 130 and between two portions of the dielectric material 172. An etching process has been performed to open a trench 116 in the substrate 102 by removing the shallow trench isolation material 126 exposed by the mask 174. The bottom of the gate metal 162 is still covered by the high-K dielectric layer of the gate dielectric 158. Accordingly, the gate metal 162 is not exposed by the trench 116 at this stage of processing.

Figure 2W:
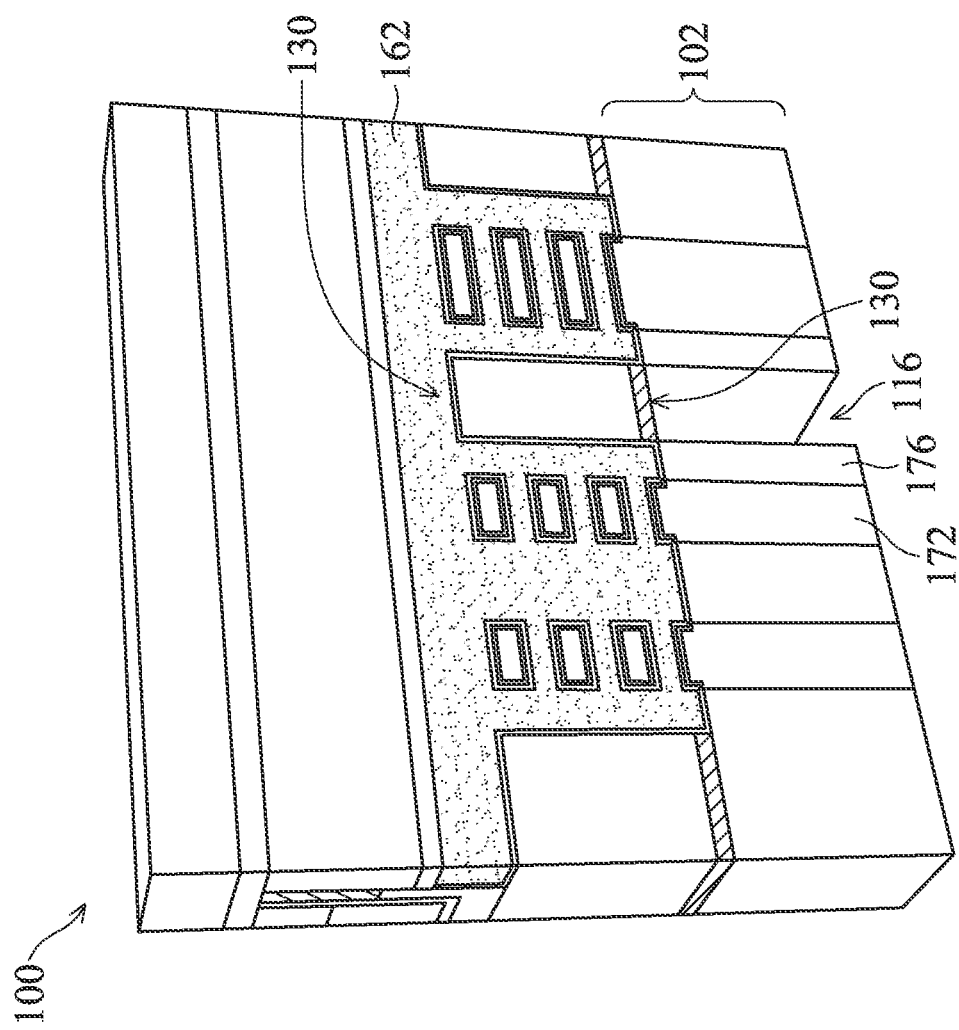

In FIG. 2W, a dielectric liner 176 has been formed on the sides of the dielectric fin structures 172. This can also correspond to forming the dielectric liner 176 on sidewalls of the trench 116. The dielectric liner 176 is positioned below and in contact with the portions of the gate dielectric 158 that were exposed by the trench 116 in FIG. 2V. Accordingly, the bottom portions of the gate dielectric 158 that were exposed by the trench 116 in FIG. 2V are no longer exposed in FIG. 2W. The liner layer 176 can include silicon nitride and can be deposited by CVD, ALD, or PVD. Other materials and deposition processes can be utilized for the liner layer 176 without departing from the scope of the present disclosure.

Figure 2X:
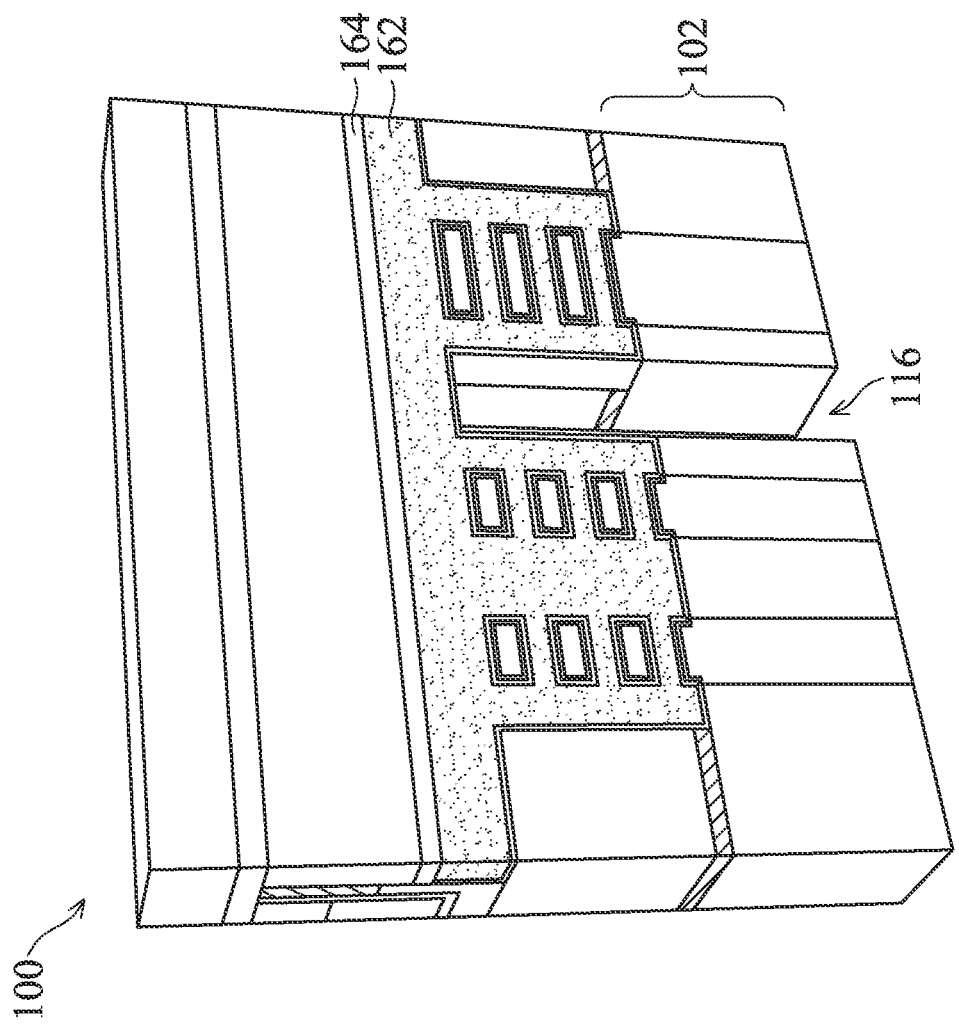

In FIG. 2X, the hybrid fin 130 has been removed. The hybrid fin can be removed by one or more etching processes that selectively etch the materials of the hybrid fin with respect to the gate dielectric 158 and the liner layer 176. The gate dielectric 158 is now exposed in the trench 116.

Figure 2Y:
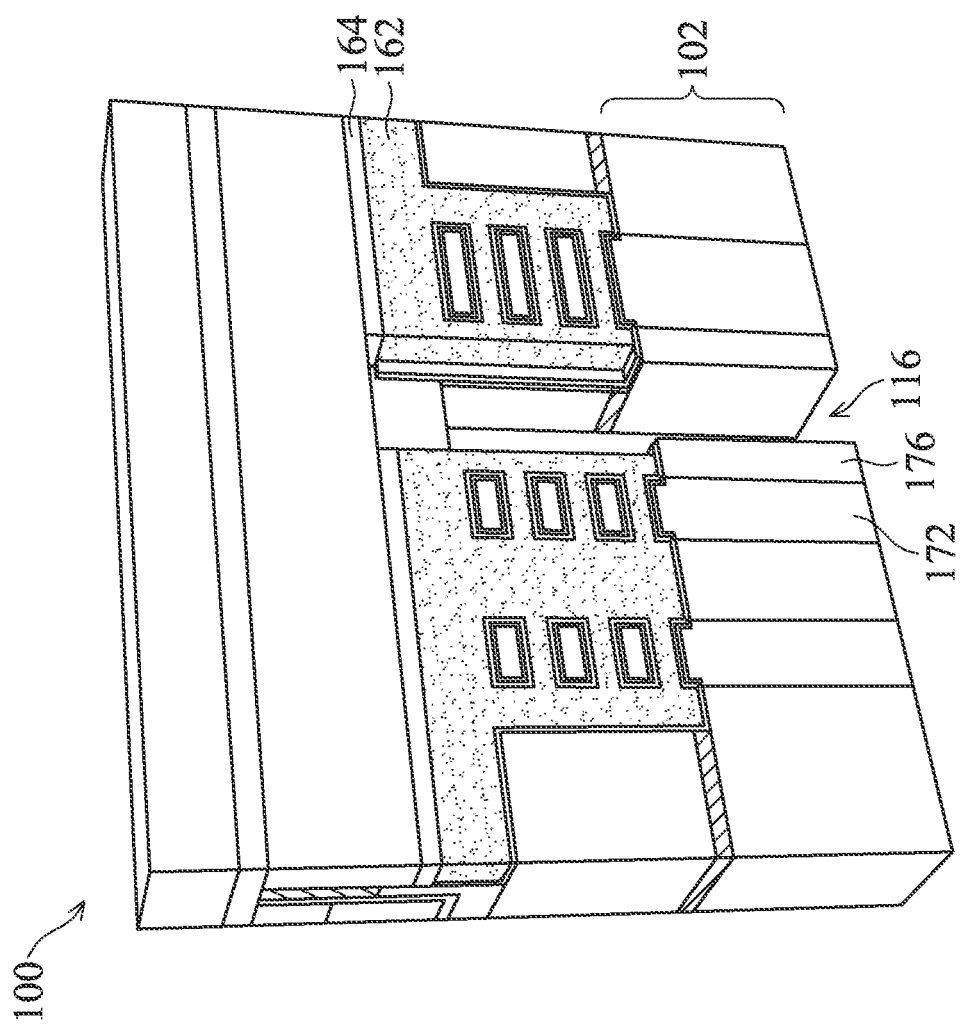

In FIG. 2Y, an etching processes been performed to etch the portions of the high-K layer in gate dielectric 158, the gate metals 162 and 164 exposed vertically in the trench 116. The etching process is an anisotropic etching process that etches selectively in the downward direction (because the integrated circuit is flipped at this stage) so that lateral portions of the gate metals 162 and 164 are not etched. The etching process physically and electrically separates portions of the gate metals 162 and 164. This helps define gate electrodes of nanosheet transistors, as will be described in further detail below. After etching gate metals 162 and 164, the gate metals can be further trimmed for depositing dielectric material in a wider space. A high-K dielectric foot will be found above trench sidewall spacer.

The etching of the gate metals 162 and 164 can be described as a gate cut process. The gate cut process is beneficial because the trench 116 extending through the gate metals 162 and 164 is self-aligned with the previous position of the hybrid fin 130. Accordingly, a separate photolithography process is not utilized after opening the trenches 116 and the substrate 102. Furthermore, the trench 116 in the backside of the substrate 102 is relatively narrow due to the presence of the liner layers 176.

Figure 2Z:
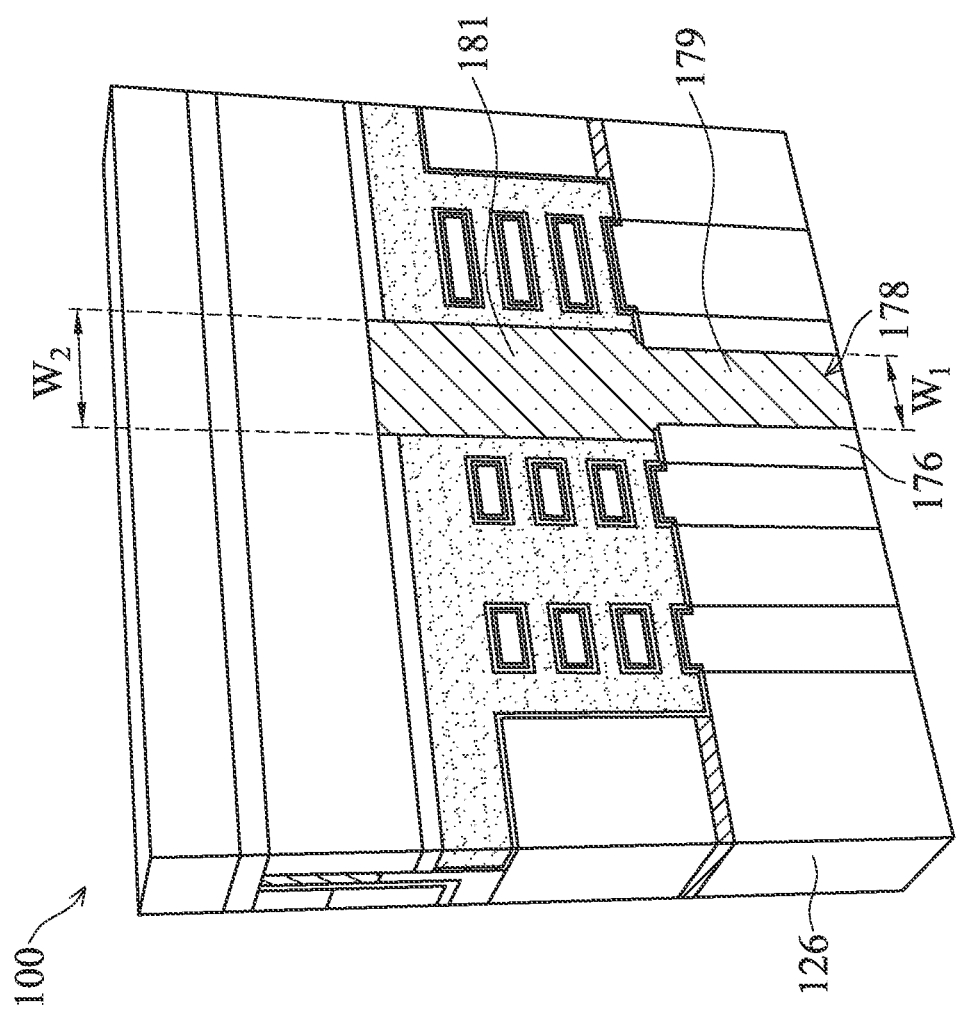

In FIG. 2Z, a gate isolation structure 178 has been formed has been in the trench 116. The gate isolation structure 178 further promotes electrical isolation of the various regions of the gate metals 162 and 164. The dielectric material of the gate isolation structure can include a low K dielectric material. The dielectric material 178 can include SiCN, silicon oxide nitride, silicon dioxide, silicon nitride, or other suitable dielectric materials. The gate isolation structure 178 can be formed by CVD, PVD, ALD, or other deposition processes. Other materials and processes can be utilized for the dielectric material 178 without departing from the scope of the present disclosure.

In some embodiments, the gate isolation structure 178 has a first portion 179 and a second portion 181. The first portion 179 is a lower portion. The second portion 181 is an upper portion. The first portion 179 has a width W1. The second portion 181 has a width W2. The second width W2 is greater than the first width W1. In some embodiments, the first portion 179 may have a different material than the second portion 181. In these cases, the gate isolation structure 178 may be formed in multiple deposition steps of different dielectric materials.

In some embodiments, the bottom surface of the gate isolation structure 178 is coplanar with the bottom surface of the dielectric fin structure 172. In particular, the bottom surface of the bottom portion 179 is coplanar with the bottom surface of the dielectric fin structure 172. The bottom surface of the gate isolation structure 178 is also coplanar with the bottom surface of the shallow trench isolation layer 126.

Figure 3A:
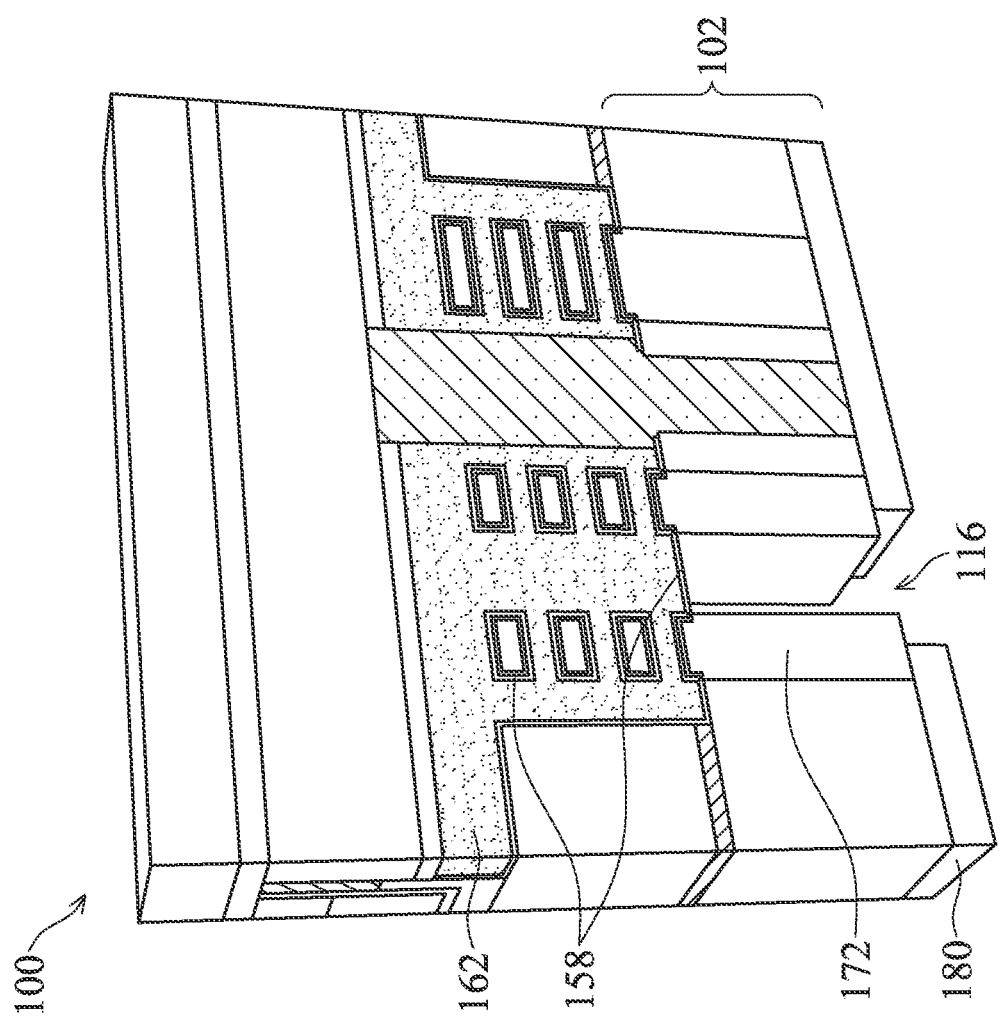

In FIG. 3A, a mask 180 has been formed on the backside of the substrate 102. The mask 180 has been patterned to expose the shallow trench isolation material 126 below the gate metal 162 and between two portions of the dielectric material 172. An etching process has been performed to open a trench 116 in the substrate 102 by removing the shallow trench isolation material 126 exposed by the mask 180. A portion of the gate metal 162 is also exposed by the trench 116. The gate metal 162 is still covered by high-K dielectric layer of the gate dielectric 158. Accordingly, the gate metal 162 is not exposed by the trench 116.

Figure 3B:
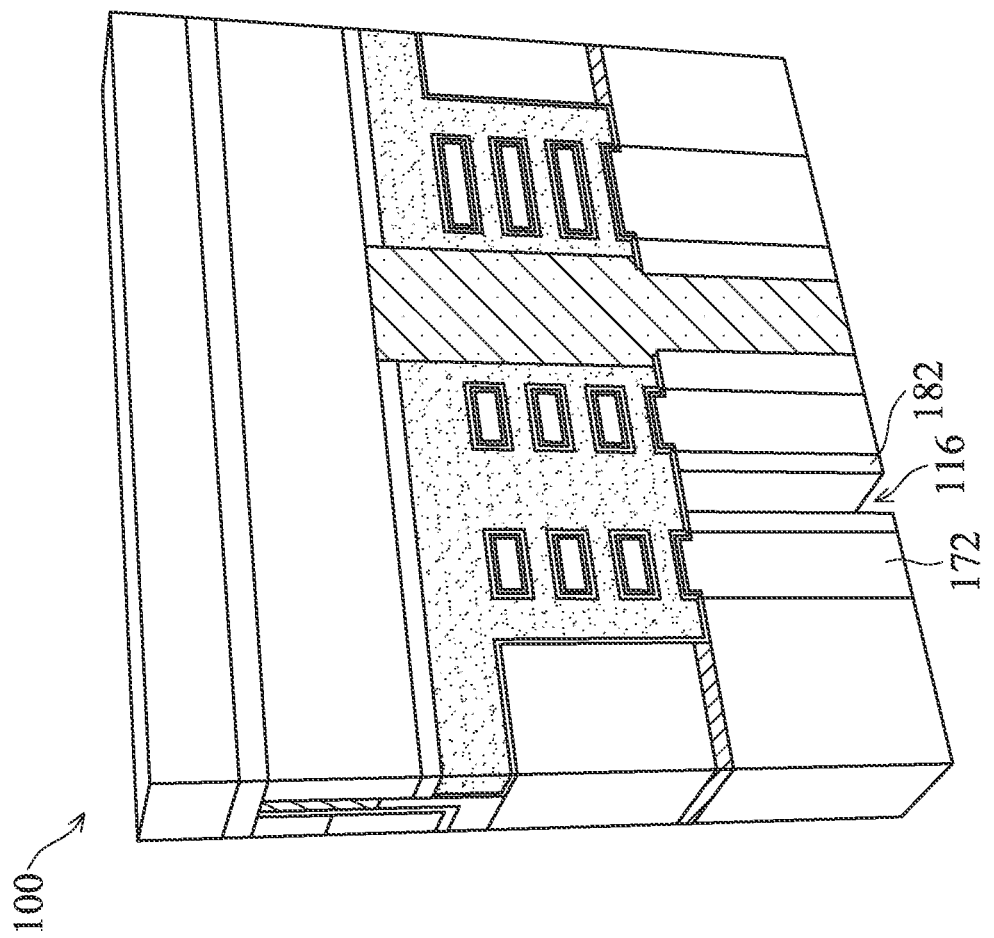

In FIG. 3B, a dielectric liner 182 has been formed on the sidewalls of the trench 116 and the substrate 102. The dielectric liner 182 covers the portions of the gate dielectric 158 that were exposed by the trench 116 in FIG. 3A. Accordingly, the bottom portions of the gate dielectric 158 that were exposed by the trench 116 in FIG. 3A are no longer exposed in FIG. 3B. The liner layer 182 can include silicon nitride and can be deposited by CVD, ALD, or PVD. Other materials and deposition processes can be utilized for the dielectric liner 182 without departing from the scope of the present disclosure. The dielectric liner 182 may be considered part of the dielectric fin structure 172.

Figure 3C:
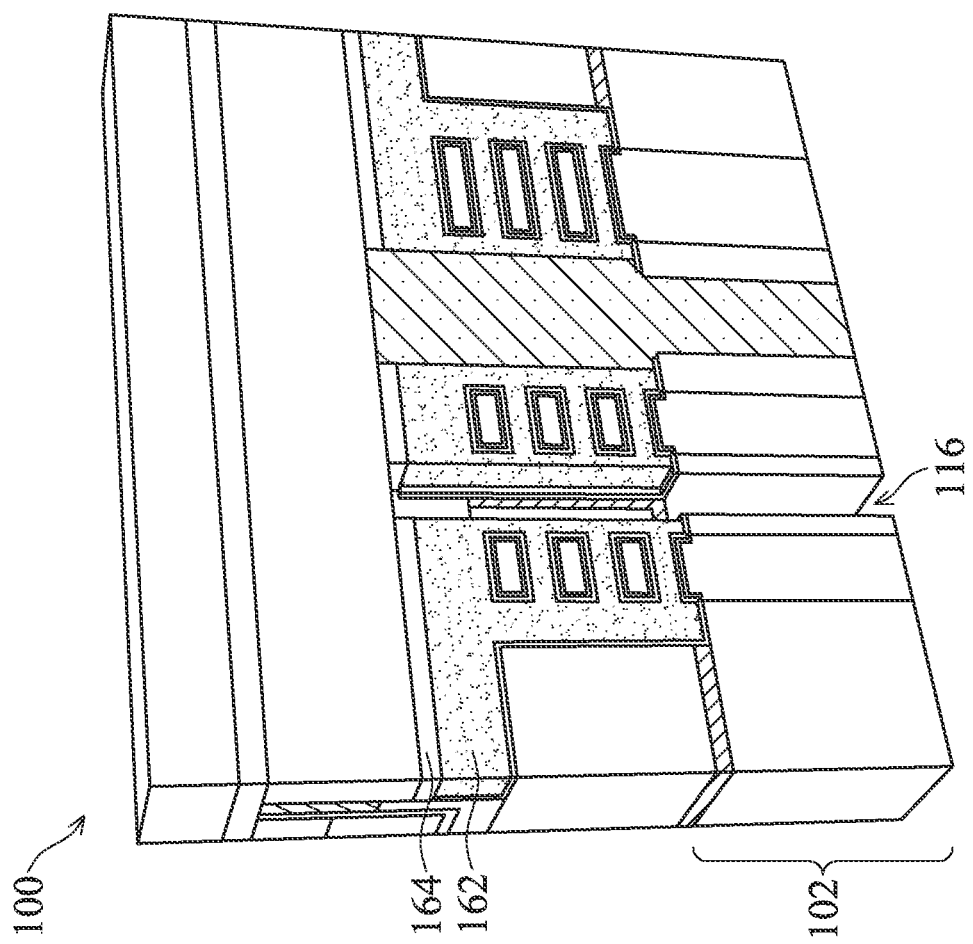

In FIG. 3C, an etching processes been performed to etch the portions of the high-K dielectric layer of the gate dielectric 158, the gate metals 162 and 164 exposed vertically in the trench 116. The etching process is an anisotropic etching process that etches selectively in the downward direction (because the integrated circuit is flipped at this stage) so that lateral portions of the gate metals 162 and 164 are not etched. The etching process physically and electrically separates portions of the gate metals 162 and 164. This helps define gate electrodes of nanosheet transistors, as will be described in further detail below.

Figure 3D:
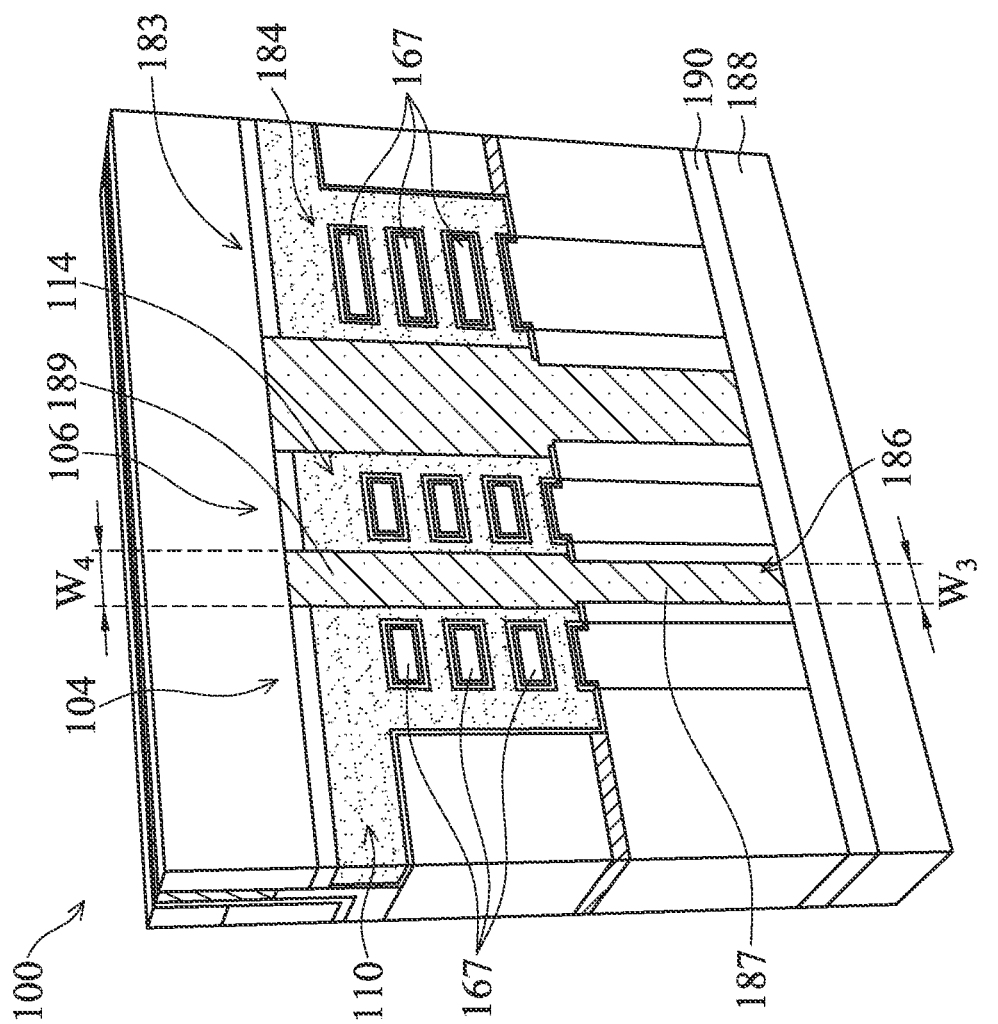

In FIG. 3D, a gate isolation structure 186 has been formed in the trench 116. The gate isolation structure 186 further promotes electrical isolation of the various regions of the gate metals 162 and 164. The gate isolation structure 186 can include a low K dielectric material. The gate isolation structure 186 can include SiCN, silicon oxide nitride, silicon dioxide, silicon nitride, or other suitable dielectric materials. The gate isolation structure 186 can be formed in the trench 116 by CVD, PVD, ALD, or other deposition processes. Other materials and processes can be utilized for the gate isolation structure 186 without departing from the scope of the present disclosure.

In some embodiments, the gate isolation structure 189 has a first portion 187 and a second portion 189. The first portion 187 is a lower portion. The second portion 189 is an upper portion. The first portion 187 has a width W1. The second portion 189 has a width W2. The second width W2 is greater than the first width W1. In some embodiments, the first portion 187 may have a different material than the second portion 189. In these cases, the gate isolation structure 186 may be formed in multiple deposition steps of different dielectric materials.

In some embodiments, the bottom surface of the gate isolation structure 186 is coplanar with the bottom surface of the dielectric fin structure 172. In particular, the bottom surface of the bottom portion 187 is coplanar with the bottom surface of the dielectric fin structure 172. The bottom surface of the gate isolation structure 186 is also coplanar with the bottom surface of the shallow trench isolation layer 126.

In FIG. 3D a second carrier wafer 188 has been attached to the backside of the integrated circuit 100 via an adhesive layer 190. The integrated circuit can then be flipped again so that the second carrier wafer 188 is positioned downward as shown in FIG. 3D. The carrier wafer 170 and the adhesive layer 168 have been removed. At this point, further fronting processing can be performed to form metal contacts, plugs, metal lines, metal interconnects, interlevel dielectric layers and other structures.

In FIG. 3D a first transistor 104, a second transistor 106, and a third transistor 183 have been formed. The first transistor 104 includes a gate electrode 110 surrounding a first set of semiconductor channels 167. The second transistor 106 includes a gate electrode 114 surrounding a second set of semiconductor channels 167. The third transistor 183 includes a gate electrode 184 surrounding a third set of semiconductor channels 167. Each of the gate electrodes 110, 114, and 183 are formed from the gate metals 162 and 164. Each of the gate electrodes 110, 114, and 183 are electrically and physically isolated from each other by the gate isolation structures 186 and 178 in the backside trenches 116. Though not shown in the view of FIG. 3B, each of the transistors 104, 106, and 183 include source/drain regions 152. In particular, each of the transistors 104, 106, and 183 includes a source region and a drain region. The gate dielectric 158 separate the various gate electrodes 104, 106, and 183 from the semiconductor channels 167.

Figure 3E:
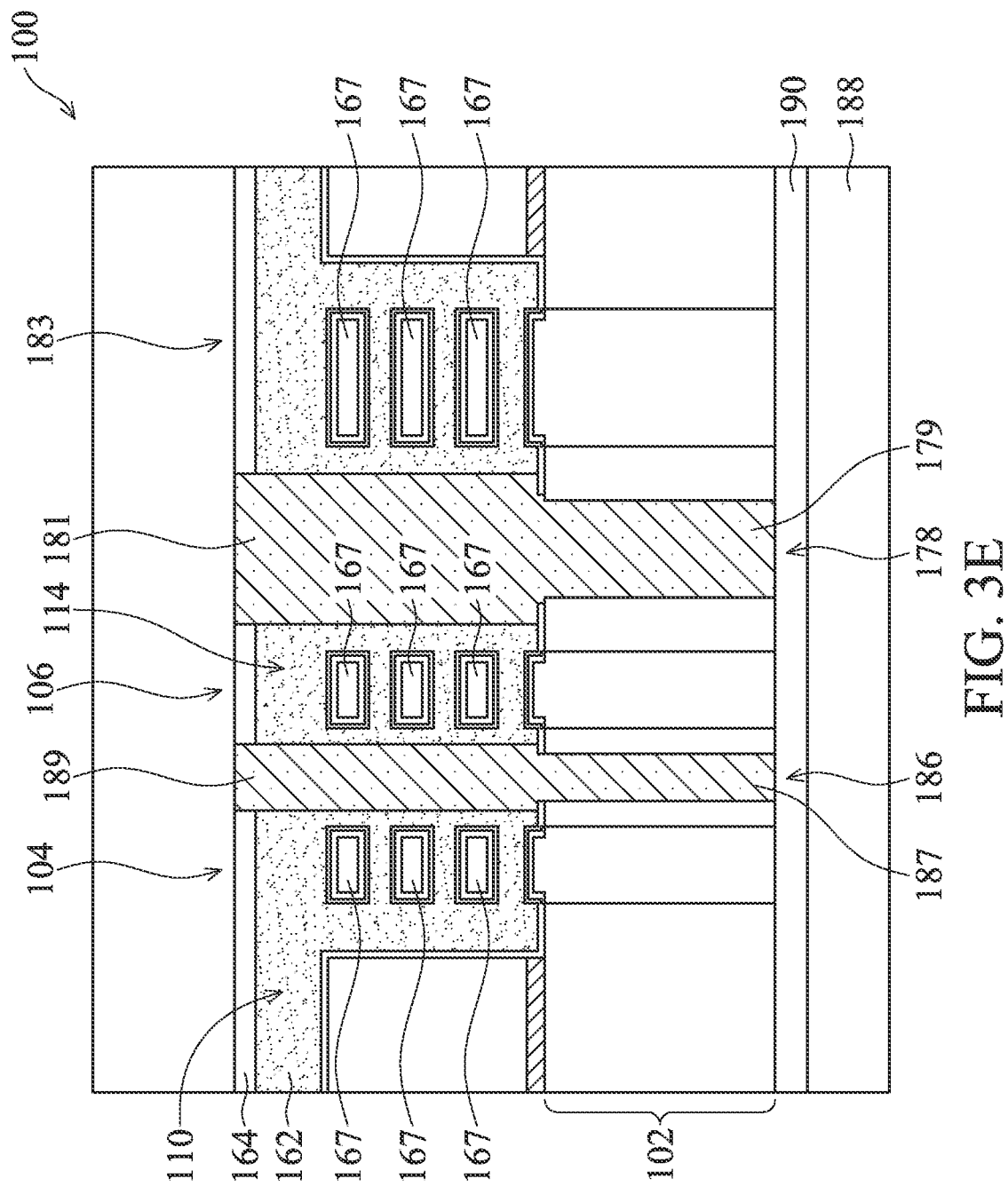

FIG. 3E is a side view of the integrated circuit 100 at the stage of processing shown in FIG. 3D. FIG. 3E illustrates the transistors 104, 106, and 183 separated by gate isolation structures 186 and 178 as described above in relation to FIG. 3D.

FIG. 3F is a side view of an integrated circuit 100 at the stage of processing shown in FIG. 3D, but showing the source and drain regions 152 similar to the view of FIG. 2M, but a side view rather than a perspective view. The gate isolation structures 186 and 170 are present in FIG. 3F. A hybrid fin 130 still remains between two of the source/drain regions 152 above the gate isolation structure 186. The left source/drain region 152 is a source/drain region of the transistor 104. The center source/drain region 152 is a source/drain region 152 of the transistor 106. The right source/drain region 152 is a source/drain region 152 of the transistor 183. In FIG. 3F, the upper portion 181 and the lower portion 179 have substantially a same width along the direction corresponding to the cross-section of FIG. 3F. The upper portion 181 and the lower portion 179 have different widths along the direction correspond to the cross-section of FIG. 3E.

Figure 4:
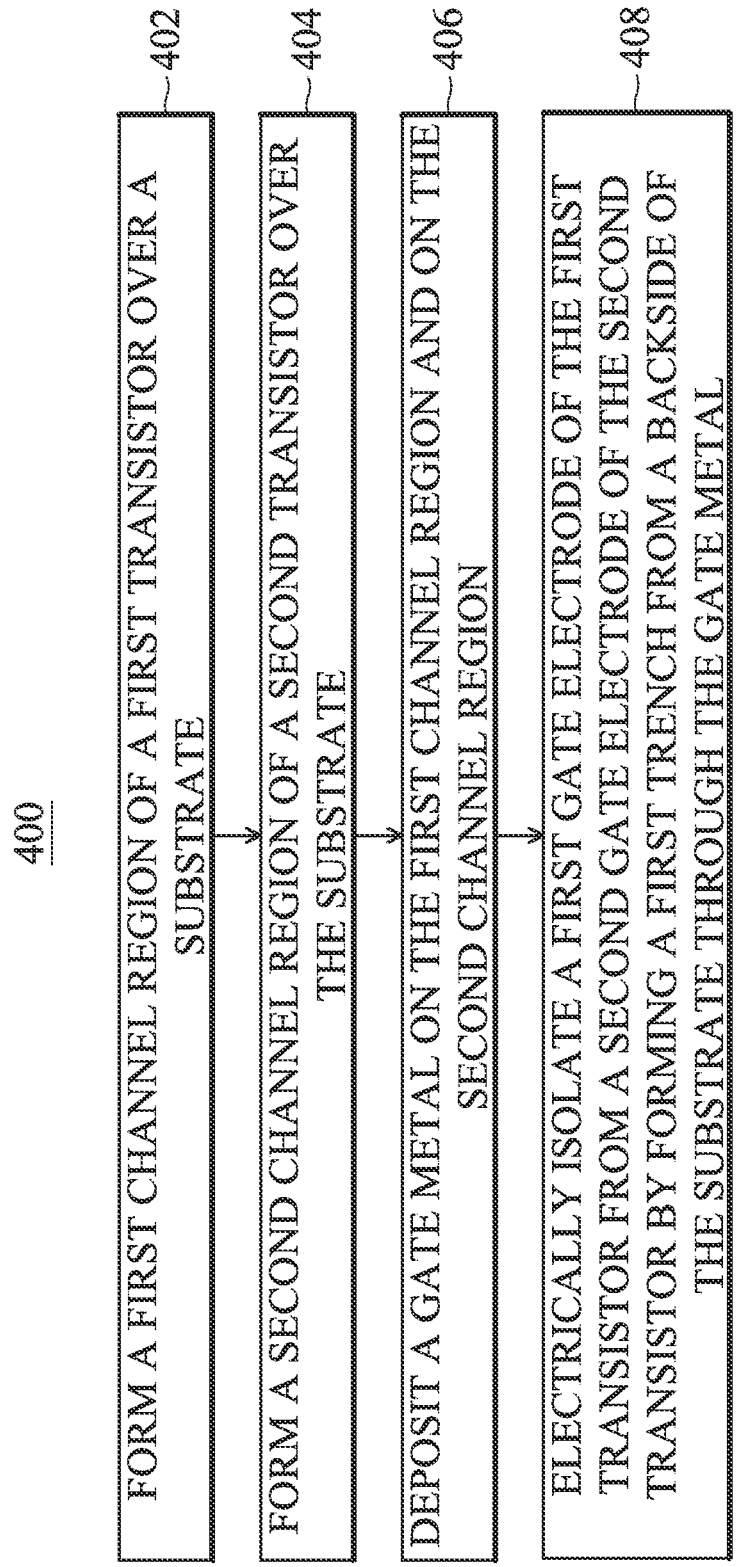
FIG. 4 is a flow diagram of a process for forming an integrated circuit, in accordance with some embodiments.

FIG. 4 is a flow diagram of a method 400 for forming an integrated circuit, in accordance with some embodiments. The method 400 can utilize processes, structures, or components described in relation to FIGS. 1-3F. At 402, the method 400 includes forming a first channel region of a first transistor over a substrate. One example of a first channel region is the channel region 108 of FIG. 1. One example of a substrate is the substrate 102 of FIG. 1. At 404, the method 400 includes forming a second channel region of a second transistor over the substrate. One example of a second channel region is the second channel region 112 of FIG. 1. At 406, the method 400 includes depositing a gate metal on the first channel region and on the second channel region. One example of a gate metal is the gate metal 162 of FIG. 2R. At 408, the method 400 includes electrically isolating a first gate electrode of the first transistor from a second gate electrode of the second transistor by forming a trench from a backside of the substrate through the gate metal. One example of a first gate electrode is the gate electrode 110 of FIG. 1. One example of a second gate electrode is the gate electrode 114 of FIG. 1. One example of a trench is the trench 116 of FIG. 1.

Figure 5:
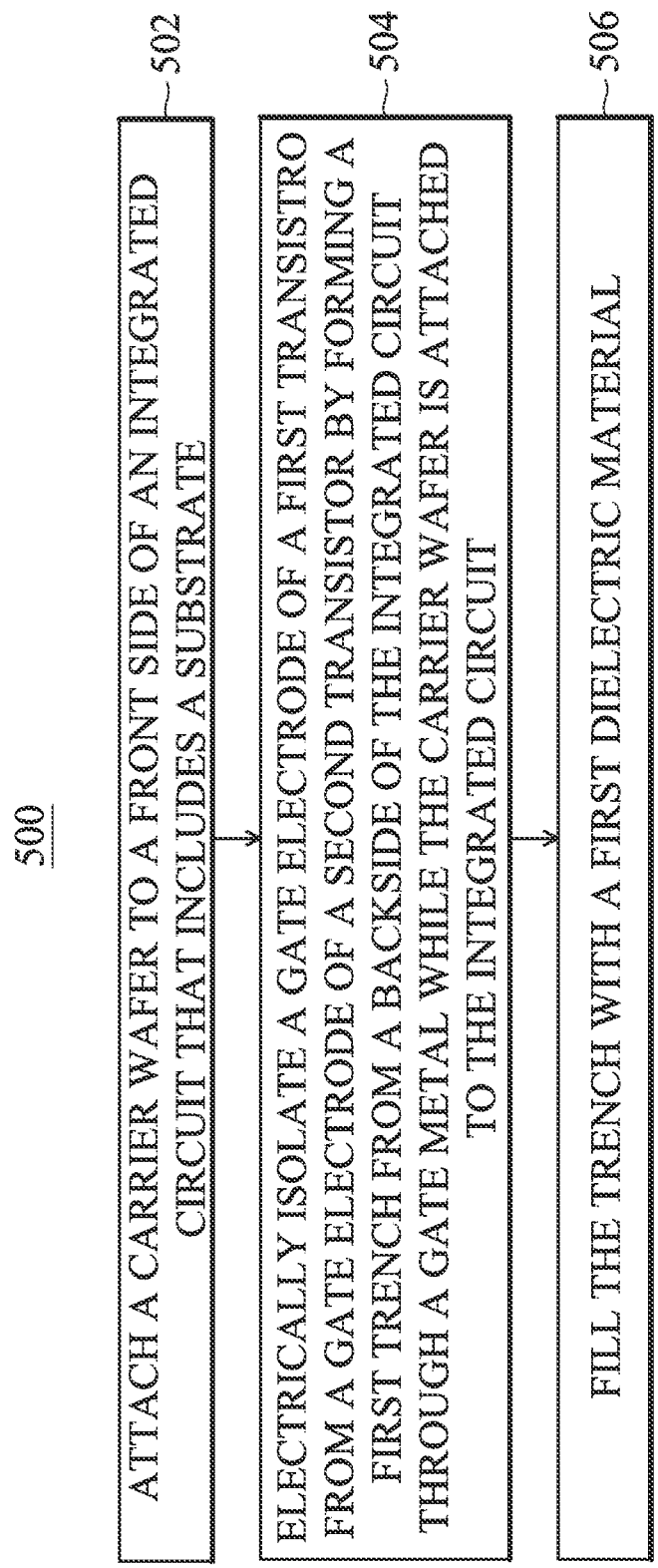
FIG. 5 is a flow diagram of a process for forming an integrated circuit, in accordance with some embodiments.

FIG. 5 is a flow diagram of a method 500 for forming an integrated circuit, in accordance with some embodiments. The method 500 can utilize processes, structures, and components described in relation to FIGS. 1-4. At 502, the method 500 includes attaching a carrier wafer to a front side of an integrated circuit that includes a substrate. One example of an integrated circuit is the integrated circuit 100 of FIG. 1. One example of a carrier wafer is the carrier wafer 170 of FIG. 2U. One example of a substrate is the substrate 102 of FIG. 1. At 504, the method 500 includes electrically isolating a gate electrode of a first transistor from a gate electrode of a second transistor by forming a first trench from a backside of the integrated circuit through a gate metal while the carrier wafer is attached to the integrated circuit. One example of a first transistor is the first transistor 104 of FIG. 1. One example of a second transistor is the second transistor 106 of FIG. 1. One example of a gate electrode of a first transistor is the gate electrode 110 of FIG. 1. One example of a gate electrode of a second transistor is the gate electrode 114 of FIG. 1. One example of a first trench is the trench 116 of FIG. 1. At 506, the method 500 includes filling the first trench with a first dielectric material. One example of a first dielectric material is the dielectric material 178 of FIG. 2Z.

Embodiments of the present disclosure provide an integrated circuit with nanosheet transistors having improved performance. The nanosheet transistors each have a plurality of nanosheets formed over a substrate. The nanosheets act as channel regions of the nanosheet transistor. Each nanosheet transistor includes a gate electrode over the channel region. When the gate metals of the gate electrodes are initially deposited, all of the gate electrodes may initially be electrically shorted together. Embodiments of the present disclosure advantageously electrically isolate the individual gate electrodes by utilizing backside trenches to cut the gate metals. The backside trenches are etched from the backside of the substrate and through the gate metals. The backside trenches cut through the gate metals between the transistors and thereby remove conductive materials that would otherwise electrically short the gate electrodes of adjacent transistors.

This process provides many benefits. Gate metals can be cut and hybrid fins that separate adjacent transistors can be removed in a self-aligned process. This can avoid utilizing a separate photolithography process to cut the gate metals. Furthermore, an isolation wall can replace the hybrid fin within a narrower space, thereby allowing high density formation of transistors. Alternatively, a wider isolation wall can be utilized and achieve better isolation capability. Furthermore, transistor heights can be reduced utilizing this process. All of this results in more cost-effective and efficient formation of transistors, better functioning transistors, and higher wafer yields.

In some embodiments, an integrated circuit includes a substrate and a first nanosheet transistor over the substrate. The first nanosheet transistor includes a first gate electrode, a first plurality of stacked channels, and a first dielectric fin structure below the first plurality of stacked channels. The integrated circuit includes a second nanosheet transistor over the substrate. The second nanosheet transistor includes a second gate electrode, a second plurality of stacked channels, and a second dielectric fin structure below the second plurality of stacked channels. The integrated circuit includes a gate isolation structure between the first nanosheet transistor and the second nanosheet transistor, wherein a bottommost surface of the gate isolation structure is substantially coplanar with a bottommost surface of the first dielectric fin structure.

In some embodiments, a method includes forming a first channel region of a first transistor over a substrate and forming a second channel region of a second transistor over the substrate. The method includes depositing a gate metal on the first channel region and on the second channel region and electrically isolating a first gate electrode of the first transistor from a second gate electrode of the second transistor by forming a trench from a backside of the substrate through the gate metal.

In some embodiments, a method includes attaching a carrier wafer to a front side of an integrated circuit that includes a substrate, electrically isolating a gate electrode of a first transistor from a gate electrode of a second transistor by forming a first trench from a backside of the wafer through a gate metal while the carrier wafer is attached to the integrated circuit, and filling the trench with a first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first channel region of a first transistor over a substrate;
    forming a second channel region of a second transistor over the substrate;
    depositing a gate metal on the first channel region and on the second channel region; and
    electrically isolating a first gate electrode of the first transistor from a second gate electrode of the second transistor by forming a first trench from a backside of the substrate through the gate metal.

2. The method of claim 1, further comprising filling the first trench with a dielectric material.

3. The method of claim 2, further comprising depositing a liner layer on a sidewall of the trench in the substrate prior to filling the trench with the dielectric material.

4. The method of claim 2, further comprising:
    forming a third channel region of a third transistor;
    depositing the gate metal over the third channel region; and
    electrically isolation the second gate electrode of the second transistor from a third gate electrode of the third transistor by forming a second trench from the back side of the substrate through the gate metal, wherein the second trench is formed after the first trench.

5. The method claim 4, wherein forming the second trench includes removing a first part and a second part, wherein the second part has a width smaller than the first part along a direction along a first channel of the first channel region.

6. A method, comprising:
    attaching a carrier wafer to a front side of an integrated circuit in a substrate;
    electrically isolating a gate electrode of a first transistor from a gate electrode of a second transistor by forming a first trench from a backside of the integrated circuit through a gate metal while the carrier wafer is attached to the integrated circuit; and
    filling the first trench with a first dielectric material.

7. The method of claim 6, further comprising reducing a thickness of the substrate while the carrier wafer is attached and before etching the first trench.

8. The method of claim 6, wherein etching the first trench includes etching the first trench through a trench isolation region of the substrate.

9. The method of claim 8, further comprising:
    etching second and third trenches through a semiconductor material of the substrate from the backside of the wafer while the carrier wafer is attached and before etching the first trench; and
    filling the second and third trenches with a second dielectric material.

10. The method of claim 9, further comprising:
    etching the first trench in the substrate between the second and third trenches; and
    depositing a dielectric liner on sidewalls of the first trench in contact with the second dielectric material prior to filling the first trench with the first dielectric material.

11. The method of claim 6, wherein the first dielectric material includes SiCN or silicon oxynitride.

12. A method, comprising:
    forming a substrate including semiconductor material and a trench isolation region;
    forming a first nanosheet transistor over the substrate and having a first gate electrode, a first plurality of stacked channels, and a first dielectric fin structure below the first plurality of stacked channels;
    forming a second nanosheet transistor over the substrate and having a second gate electrode, a second plurality of stacked channels, and a second dielectric fin structure below the second plurality of stacked channels;
    removing the semiconductor material of the substrate below the first plurality of stacked channels and the second plurality of stacked channels;
    depositing a first dielectric material in placed of the removed semiconductor material to form a first dielectric fin structure below the first plurality of stacked channels and to form a second dielectric fin structure below the second plurality of stacked channels;
    forming a trench through the trench isolation region between the first and second dielectric fin structures and through a gate metal connecting the first gate electrode to the second gate electrode; and
    forming a gate isolation structure between the first nanosheet transistor and the second nanosheet transistor by depositing a second dielectric material in the trench.

13. The method of claim 12, wherein a bottommost surface of the gate isolation structure is substantially coplanar with a bottommost surface of the first dielectric fin structure.

14. The integrated circuit of claim 12, wherein the gate isolation structure has an upper portion and a lower portion, wherein the upper portion is wider than the lower portion along a direction along the first gate electrode.

15. The integrated circuit of claim 12, wherein the gate isolation structure has an upper portion and a lower portion, wherein the upper portion of the gate isolation structure includes the second dielectric material, wherein the lower portion of the gate isolation structure includes a third dielectric material different material from the lower portion.

16. The method of claim 12, further comprising forming a liner layer on a sidewall of the trench below the first gate electrode and the second gate electrode prior to depositing the second dielectric material.

17. The method of claim 16, wherein the liner layer is present in the trench below the first and second gate electrodes but is not present above the substrate.

18. The method of claim 12, wherein the gate isolation structure has an upper portion and a lower portion, wherein the upper portion includes a first part in contact with the lower portion and a second part in contact with the lower portion, and the first part includes a different material from the second part.

19. The method of claim 18, wherein the first part includes a same material as the lower portion.

20. The method of claim 12, further comprising forming a bonding layer between the gate isolation structure and the substrate.

* * * * *